United States Patent [19]

Hayase et al.

[11] Patent Number: 4,871,646
[45] Date of Patent: Oct. 3, 1989

[54] POLYSILANE COMPOUND AND PHOTOSENSITIVE COMPOSITION

[75] Inventors: Shizu Hayase, Kawasaki; Rumiko Horiguchi, Yokohama; Yasunobu Onishi, Yokohama; Toru Ushirogouchi, Yokohama, all of Japan

[73] Assignee: Kabushiki Kaisha Toshiba, Kawasaki, Japan

[21] Appl. No.: 193,688

[22] Filed: May 13, 1988

[30] Foreign Application Priority Data

May 21, 1987 [JP] Japan .................................. 62-122409
Sep. 30, 1987 [JP] Japan .................................. 62-244341

[51] Int. Cl.$^4$ ............................................. G03C 1/52
[52] U.S. Cl. ..................... 430/192; 430/272; 430/270; 430/197; 525/474; 528/10; 528/14; 528/26; 556/411; 556/465; 556/467; 556/430
[58] Field of Search ............... 556/411, 465, 467, 430; 528/14, 26, 10; 430/272, 270, 192, 197; 525/474

[56] References Cited

U.S. PATENT DOCUMENTS

| | | | |
|---|---|---|---|
| 3,338,869 | 8/1967 | Haluska | 528/10 |
| 4,126,527 | 11/1978 | Kaufman | 204/159.22 |
| 4,260,780 | 4/1981 | West | 556/430 |
| 4,569,953 | 2/1986 | West et al. | 522/6 |
| 4,709,054 | 11/1987 | Rich | 549/214 |
| 4,745,169 | 5/1988 | Sugiyama et al. | 528/43 |
| 4,788,127 | 11/1988 | Bailey et al. | 430/192 |
| 4,822,716 | 4/1989 | Onishi et al. | 430/192 |

FOREIGN PATENT DOCUMENTS 0231497 8/1987 European Pat. Off. .

OTHER PUBLICATIONS

Journal of Polymer Science: Polymer Letters Ed., vol. 21, pp. 819–822, (1983).

Primary Examiner—Paul R. Michl
Assistant Examiner—C. D. RoDee
Attorney, Agent, or Firm—Oblon, Spivak, McClelland, Maier & Neustadt

[57] ABSTRACT

Disclosed are a polysilane containing a unit represented by the following formulas I, II, or III, and a photosensitive composition consisting of the polysilane.

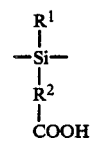

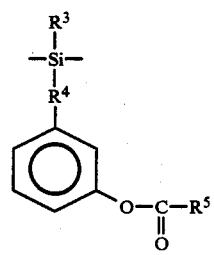

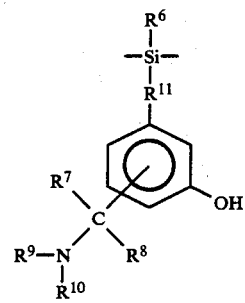

16 Claims, 13 Drawing Sheets

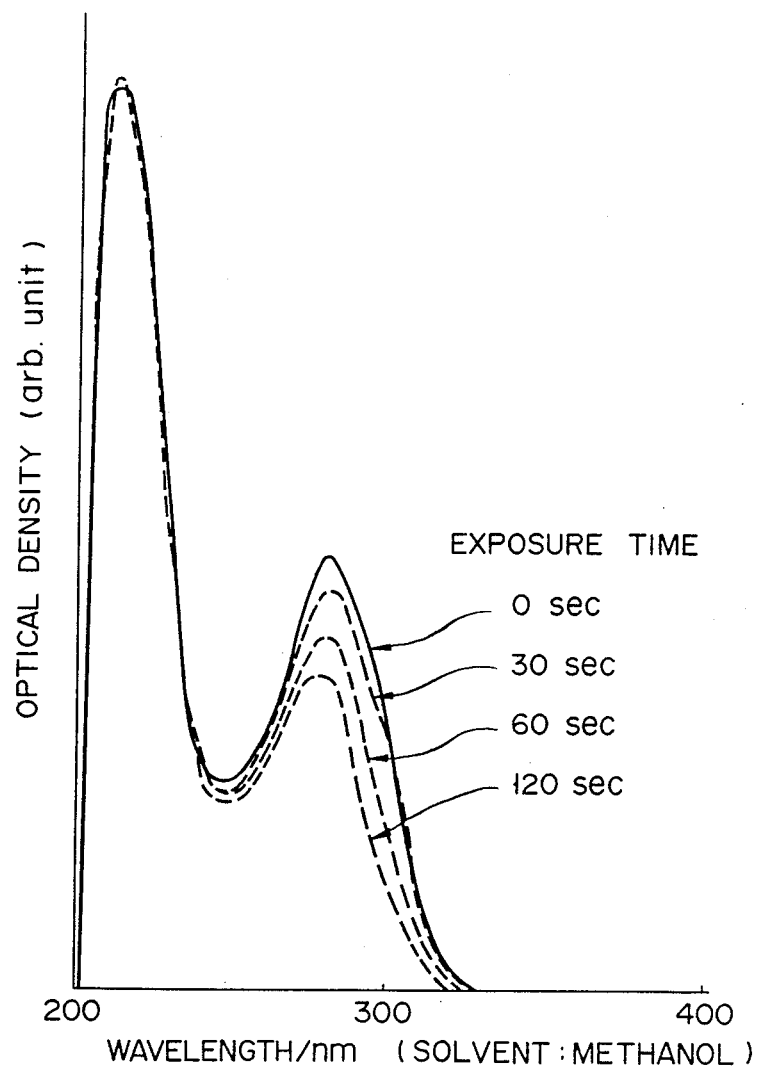
F I G. 1

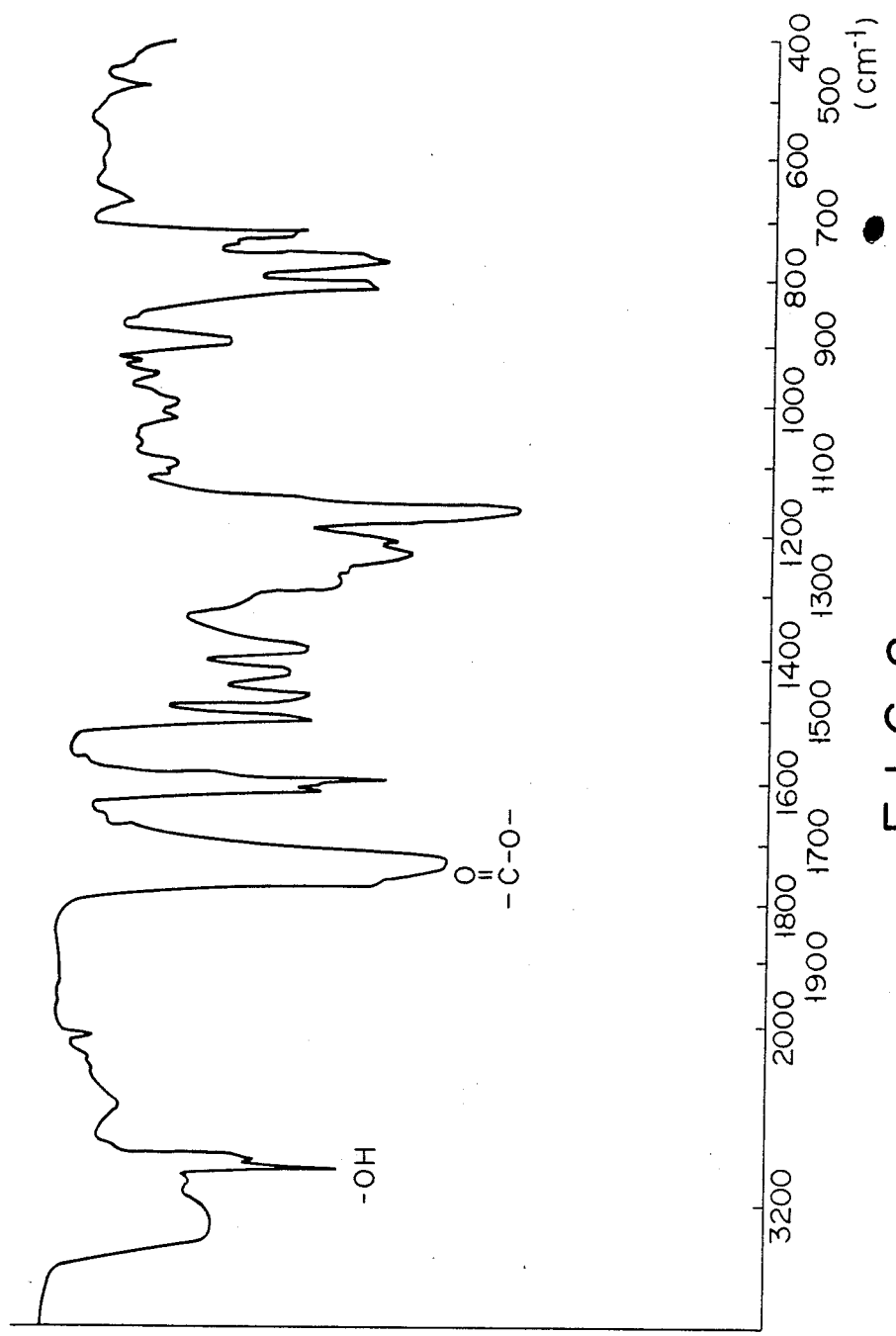
F I G. 2

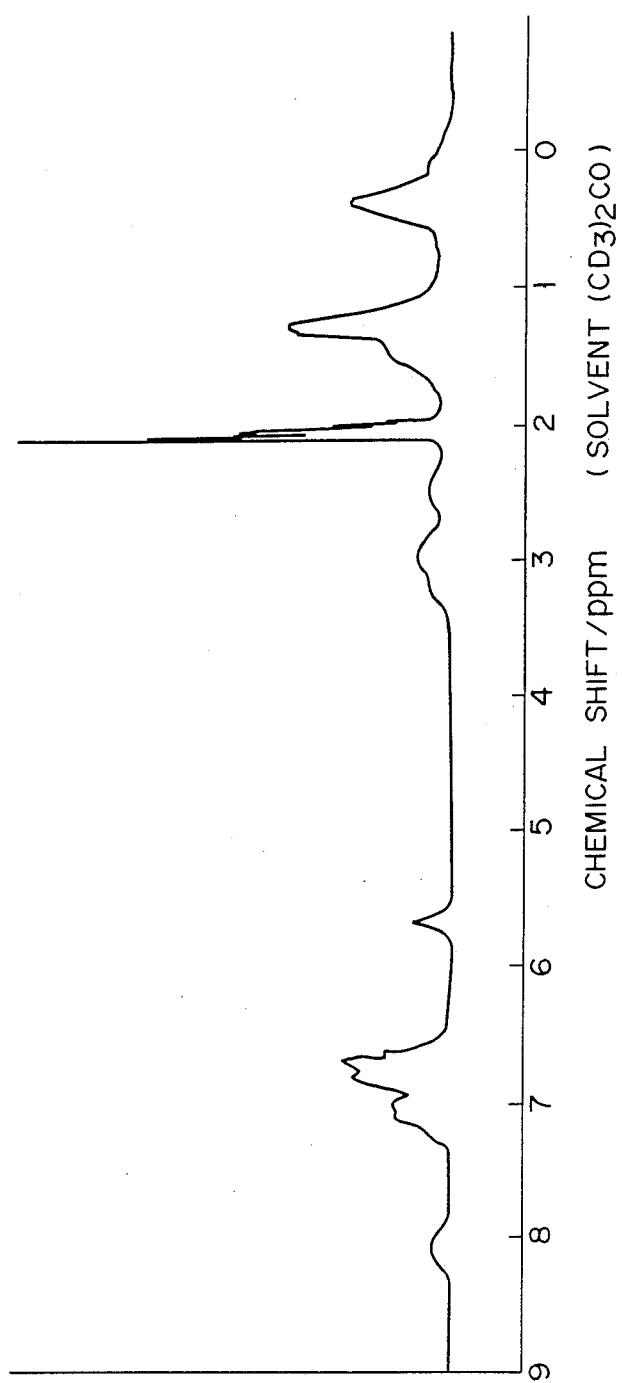
F I G. 7

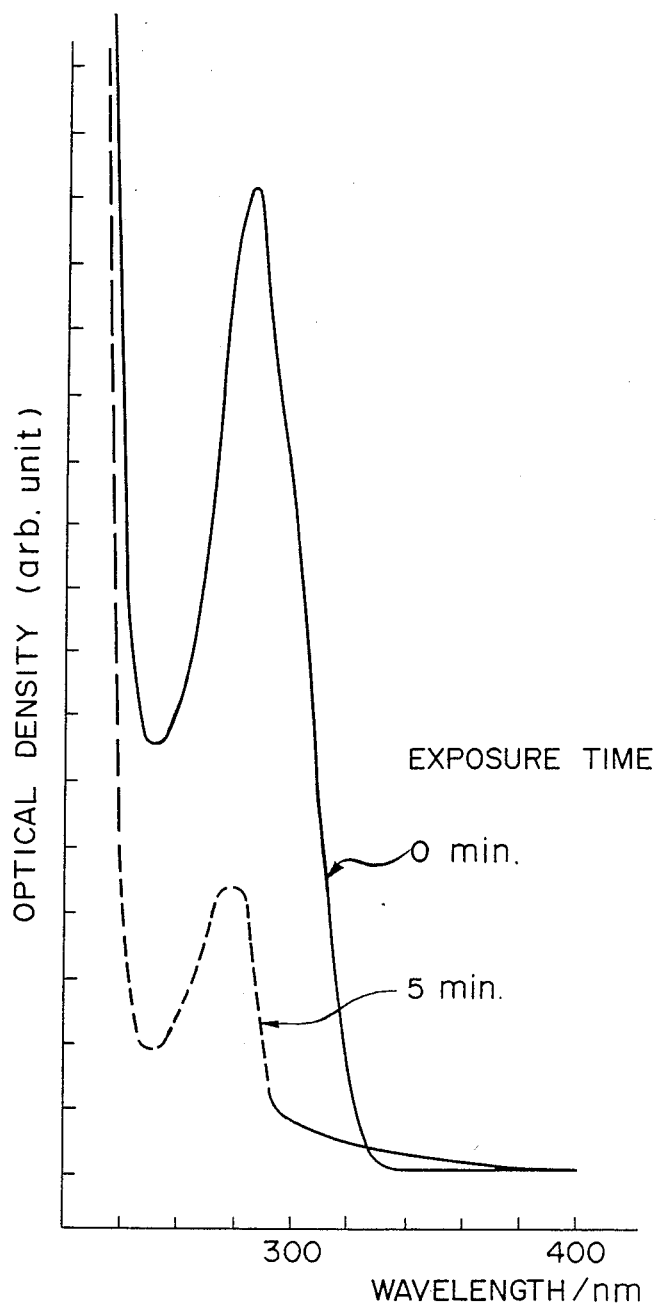
F I G. 13

POLYSILANE COMPOUND AND PHOTOSENSITIVE COMPOSITION

BACKGROUND OF THE INVENTION

1. Field of the Invention

The present invention relates to a new polysilane compound and, more particularly, to a photosensitive composition using the new polysilane compound.

2. Description of the Prior Art

Recently, R. West et al. synthesized a high-molecular polysilane soluble in a solvent (J. Am. Chem. Soc., 103, 7352, 1981).

A polysilane can be used as a precursor of a SiC. In addition, extensive studies have been made with a view to applying a polysilane to a photo resist sensitive to deep UV, a radical initiator, and a photoconductor, on the basis of the unique characteristics inherent to an Si-Si bond. Of the above applications, the application of a polysilane to a photo resist sensitive to deep UV is expected to be most promising, due to the polysilane's excellent oxygen-plasma resistance, a property which is required of a photo resist if it is to be photo-engraved by means of a recently developed double-layer resist system photoengraving process which employs reactive ion etching using oxygen-plasma.

In the case of the above conventional polysilane synthesized by R. West et al., all the side chains bonded to Si, which constitutes a backbone chain (Si-Si bond), are hydrocarbons. Therefore, this polysilane is a nonpolar compound and hence is soluble in nonpolar solvents such as toluene, xylene, or benzene, but is insoluble in polar solvents such as methanol, acetone, or water. As a result, the number of applications in which this polysilane can be used is somewhat limited.

SUMMARY OF THE INVENTION

It is, therefore, a first object of the present invention to provide a new polysilane compound which is soluble in polar solvents such as ethanol, acetone, or water, as well as in nonpolar solvents.

It is a second object of the present invention to provide a photosensitive composition comprising a polysilane which, constituting a main component, is soluble in polar solvents and, more preferably, to provide a photosensitive composition which can be developed in an aqueous alkaline solution.

The above first object of the present invention can be achieved by a polysilane comprising at least one unit selected from the group consisting of units represented by the following formulas I, II, and III:

wherein $R^1$ represents a substituted or nonsubstituted alkyl or aryl group and $R^2$ represents a substituted or nonsubstituted alkylene or arylene group;

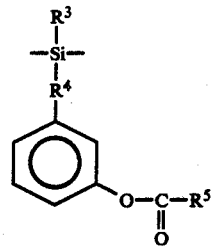

wherein
$R^3$ to $R^5$ represent the following:
$R^3$: a substituted or nonsubstituted alkyl or aryl group;
$R^4$: an alkylene group having 1 to 10 carbon atoms; and
$R^5$: a halogenated alkyl group;

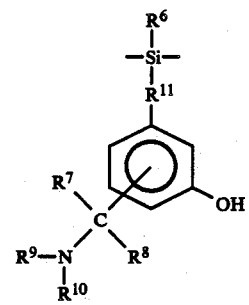

wherein
$R^6$ to $R^{11}$ represent the following:
$R^6$ to $R^{10}$: an alkyl group having 1 to 10 carbon atoms or a substituted or nonsubstituted aryl group, and $R^7$ and $R^8$ can also be hydrogen.
$R^{11}$: an alkylene group having 1 to 5 carbon atoms.

The above second object of the present invention can be achieved by a photosensitive composition containing the above polysilane as a main component. That is, the photosensitive composition according to the present invention utilizes the photosensitivity characteristics inherent to the above polysilane.

In addition the photosensitive composition, which can preferably be developed by use of an alkaline solution, can be achieved by a photosensitive composition which contains as a main component, a polysilane comprising the unit represented by formula I or the units represented by formulas I and II.

On the other hand, a photosensitive composition which contains a polysilane as a main component, said polysilane consisting of the unit represented by formula II, cannot be developed by use of an aqueous alkaline solution. It is necessary to use an organic solvent for the development.

BRIEF DESCRIPTION OF THE DRAWINGS

FIGS. 1 to 13 are charts showing the UV spectrum, the IR spectrum, and the $^1$H-NMR spectrum used to identify the chemical structure of the polysilanes synthesized in examples of the present invention.

DETAILED DESCRIPTION OF THE PREFERRED EMBODIMENTS

Figure 3:
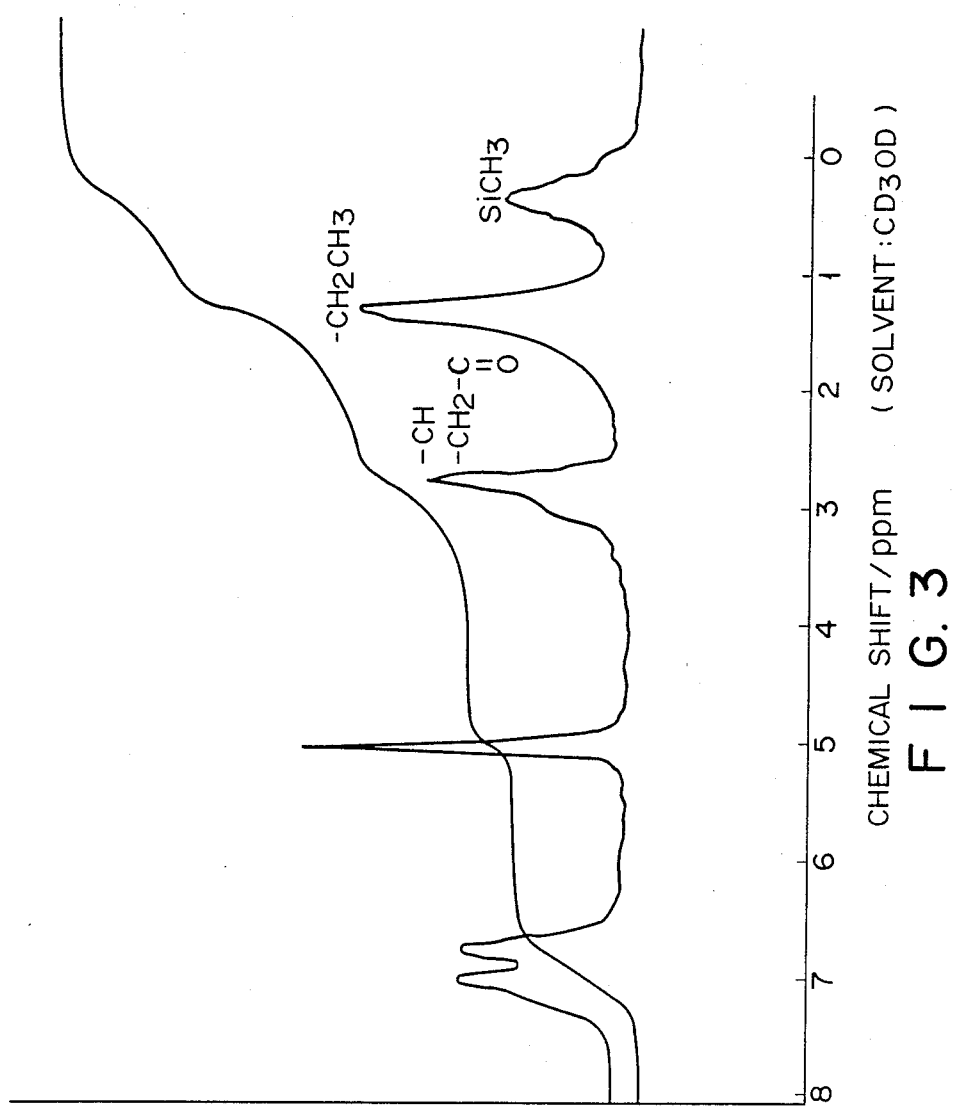

Since a polysilane according to the present invention contains a large amount of silicon, it can therefore be used as a raw material for manufacturing a fine ceramics. Since absorption of deep UV light causes radical cleavage of an Si—Si bond which constitutes a backbone chain of this polysilane, the polysilane according to the invention can therefore be used as a radical initiator. In addition, since its solubility in certain solvents is changed by photodecomposition, this polysilane can be used as a photosensitive resin such as a photo resist. Furthermore, the polysilane according to the present invention has a polar substitutent. Therefore, this polysilane is soluble in polar solvents and hence is easy to handle.

Polysilanes according to the present invention will now be described in detail below.

<Polysilane containing unit represented by formula I>

Substituent $R^1$ (a) Substituted or nonsubstituted alkyl group

Examples of an alkyl group are those having 1 to 10 carbon atoms. Examples of a substituent introduced into the alkyl group are a halogen, an oxo group, an ester group, a cyano group, a sulfinyl group, a nitrogen-containing group, a vinyl group, and an ethynyl group.

Examples of a substituted or nonsubstituted alkyl group are illustrated more concretely as follows; a methyl group, an ethyl group, an n-propyl group, an isopropyl group, an n-butyl group, an isobutyl group, a t-butyl group, a pentyl group, a cyclohexyl group, an octyl group, a nonyl group, a decyl group, a methoxypropyl group, an ethoxyethyl group, a 3-chloropropyl group, 5-fluoropentyl group, $CH_3CH_2CH_2OCOCH_2—$, $CH_3CH_2CH_2OCOCH_2CH_2—$, $CH_3CH_2CH_2OCO(CH_2)_3$, $CH_3CH_2CH_2OCO(CH_2)_4—$, $CH_3CH_2CH_2OCO(CH_2)_5—$, $CH_3CH_2CH_2CH_2OCOCH_2CH_2—$, and $CH_3(CH_2)_7OCOCH_2CH_2—$.

(b) Substituted or nonsubstituted aryl group

Examples are a phenyl group, a p-tolyl group, a p-methoxyphenyl group, an o-tolyl group, a p-trimethylsilylphenyl group, a p-butylphenyl group, a 1-naphtyl group, a 2-naphtyl group, a 6-methyl-2-naphtyl group, a 6-methoxy-2-naphtyl group, and an anthoryl group.

Substituent $R^2$ (a) Substituted or nonsubstituted alkylene group

Examples are those corresponding to alkyl groups described for $R^1$.

(b) Substituted or nonsubstituted arylene group

Examples are listed in Table 1 below.

TABLE 1

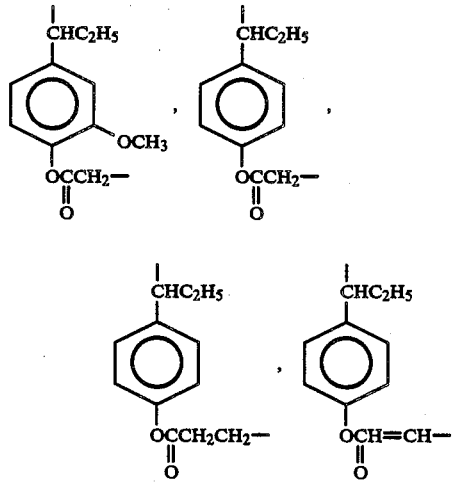

TABLE 1-continued

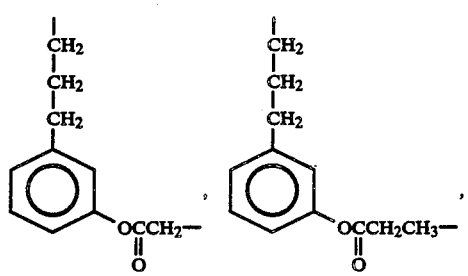

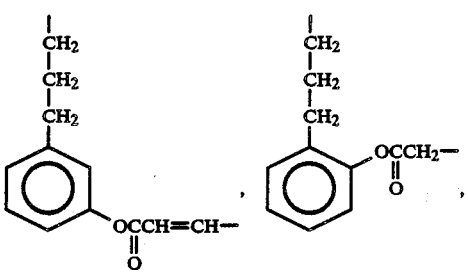

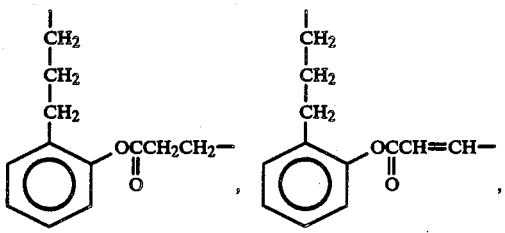

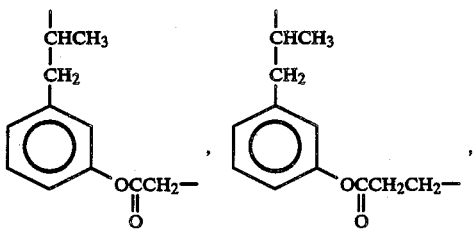

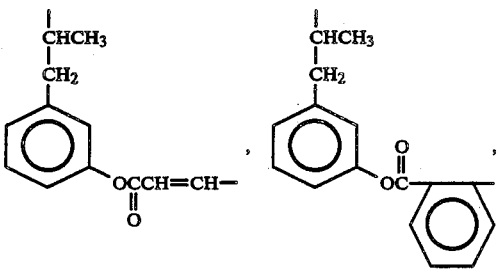

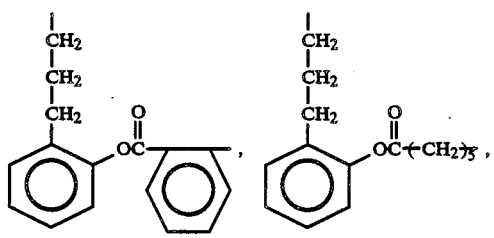

TABLE 1-continued
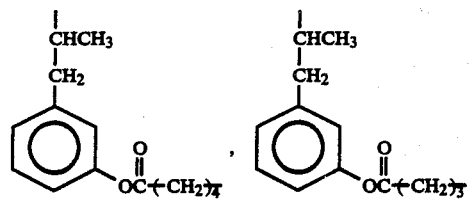
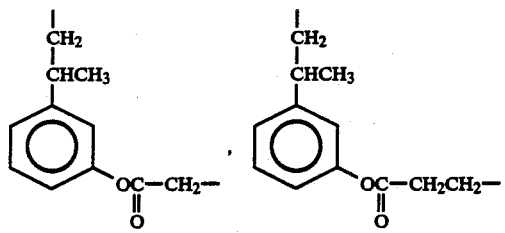
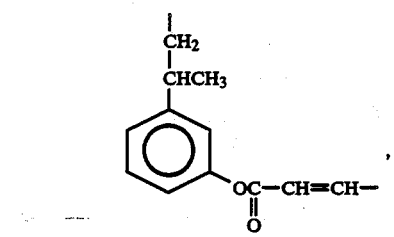
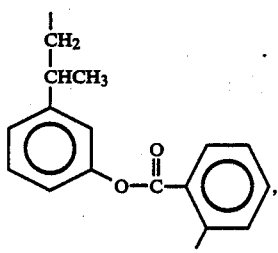
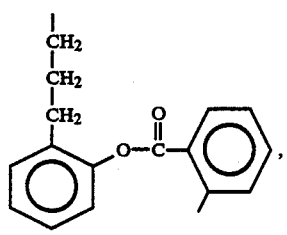
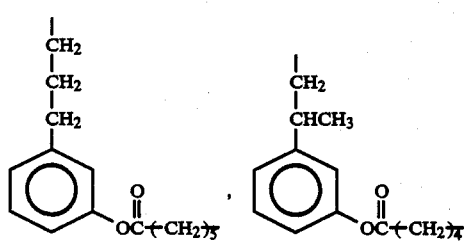
TABLE 1-continued
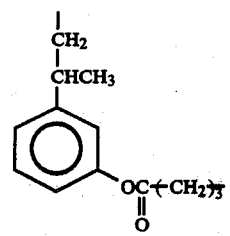
Examples of polysilane containing unit represented by formula I
The polysilane may be either a homopolymer or copolymer as represented by formula IV below as long as it contains a unit of formula 1. Examples are listed in Table 2 below.
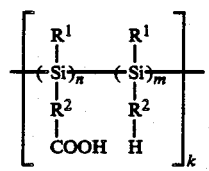
IV
TABLE 2
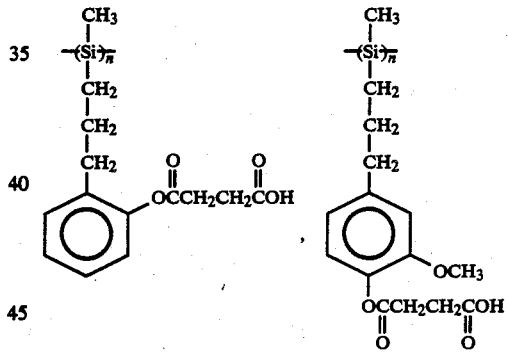
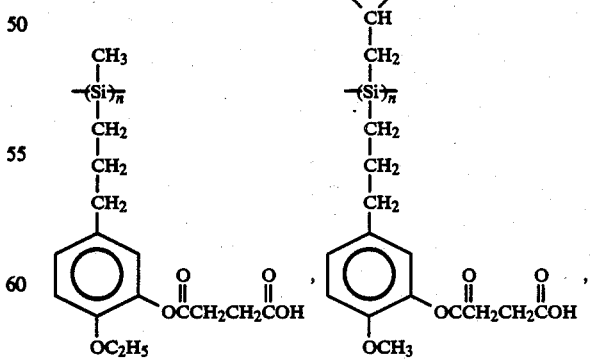

TABLE 2-continued
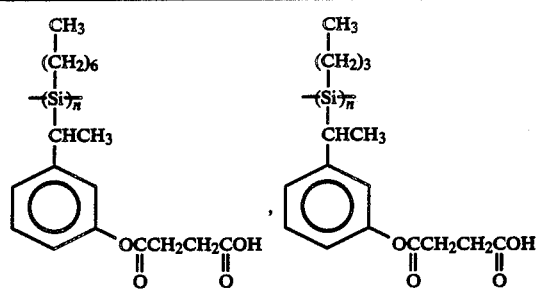
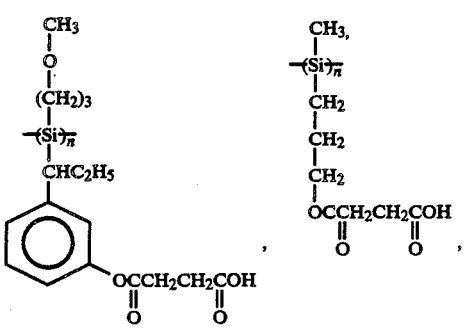
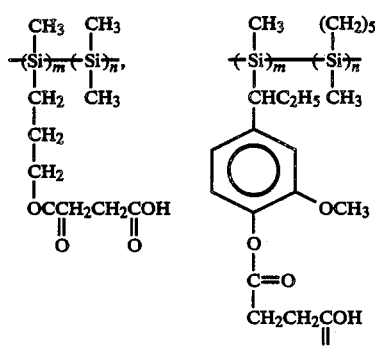
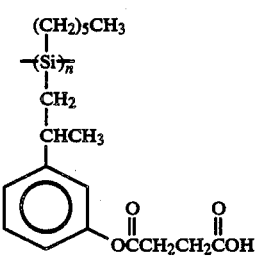
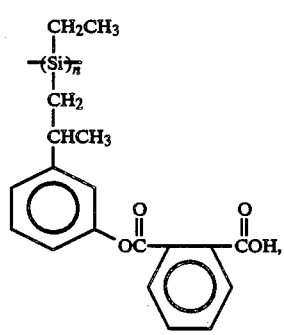
TABLE 2-continued
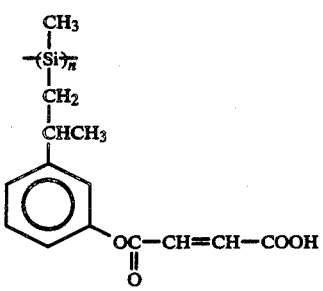
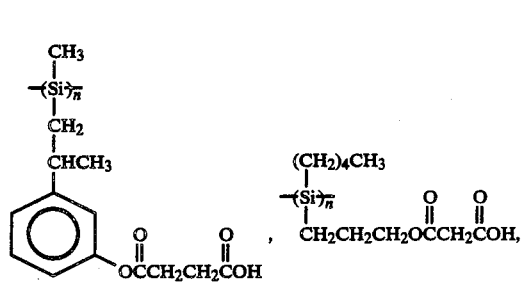
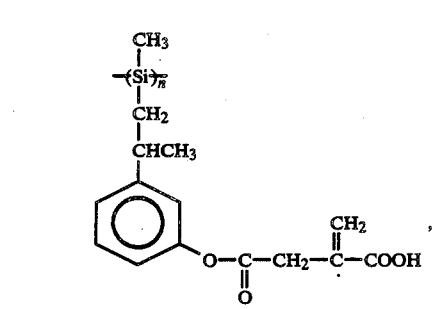
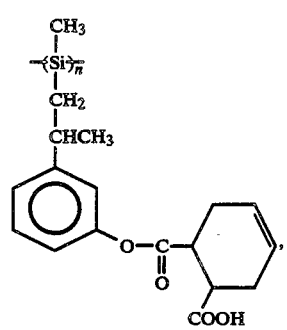
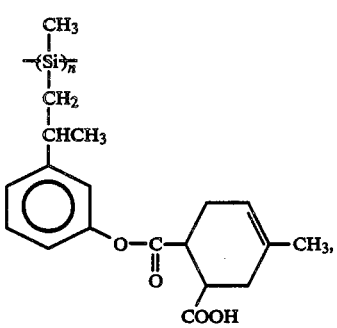

TABLE 2-continued

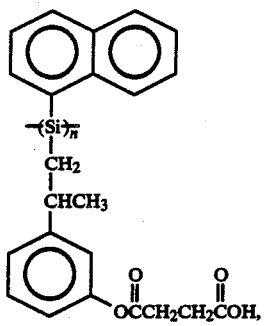

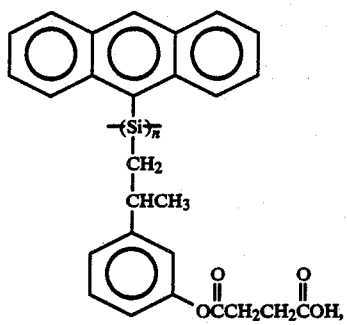

<polysilane containing unit represented by formula II>

Substituent $R^3$

Examples are a substituted or nonsubstituted alkyl group and a substituted or nonsubstituted aryl group similar to those described for $R^1$.

Substituent $R^4$

Examples of an alkylene group having 1 to 10 carbon atoms are $-CH_2-$, $-CH_2-CH_2-$, $-CH_2-CH_2-CH_2-$, $-CH_2-CH_2-CH_2-CH_2-$, $-CH_2-CH_2-$, and
$\quad\quad\quad\quad\quad\quad\quad\quad\quad\quad\quad\quad\quad\;\; |$
$\quad\quad\quad\quad\quad\quad\quad\quad\quad\quad\quad\quad\quad\;CH_3$ $-CH-$ , $-CH_2-CH-$.
$\;\;|$ $\quad\quad\quad\quad\quad\;\;|$
$CH_2CH_3$ $\quad\quad\;CH_3$

Substituent $R^5$

Examples of a halogenated alkyl group are $-CH-X_2$, $-CX_3$, $-CH_2-CH_2-X$, $-CH_2-CH-X$,
$\quad\quad\quad\quad\quad\quad\quad\quad\quad\quad\quad\quad\quad\quad\quad\quad\quad\;\;|$
$\quad\quad\quad\quad\quad\quad\quad\quad\quad\quad\quad\quad\quad\quad\quad\quad\quad\;X$ $-CH_2-CX_3$, $-CH-CX_2-X$, $-CX_2-CX_3$,
$\quad\quad\quad\quad\quad\;|$
$\quad\quad\quad\quad\;\;X$ $-CH_2-CH_2-CH_2-X$, $-CH_2-CH_2-CHX_2$, $-CH_2-CH_2-CX_3$, and $-CX_2-CX_2-CX_3$ wherein X represents F, Cl, Br, and I)

Examples of polysilane containing unit represented by formula II

The polysilane may be either a homopolymer or copolymer as long as it contains a unit of formula II. Examples are listed in Table 3 below.

TABLE 3

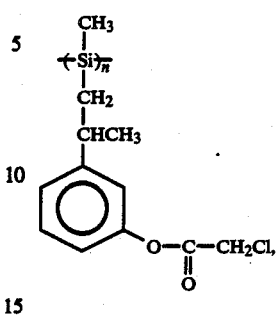

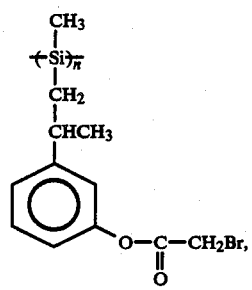

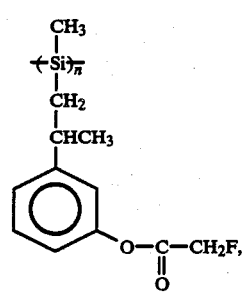

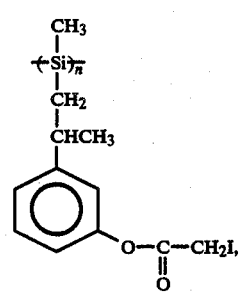

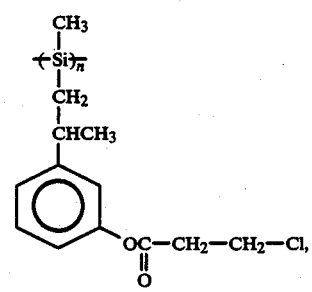

TABLE 3-continued

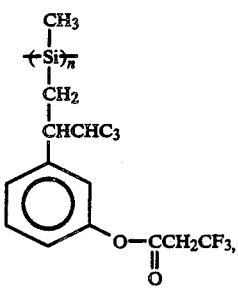

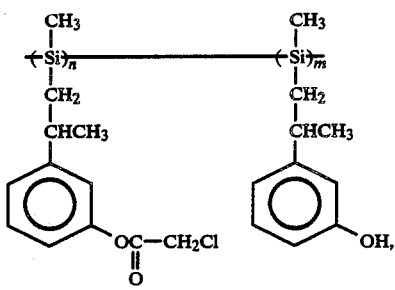

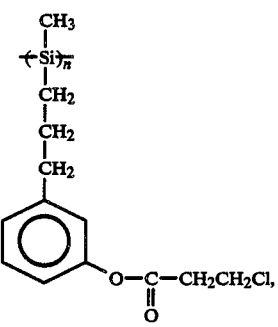

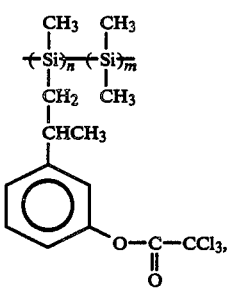

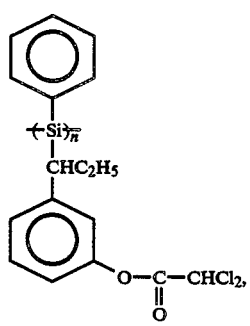

TABLE 3-continued

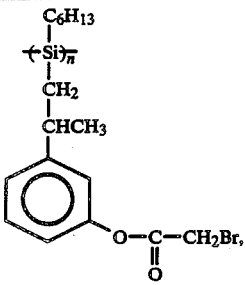

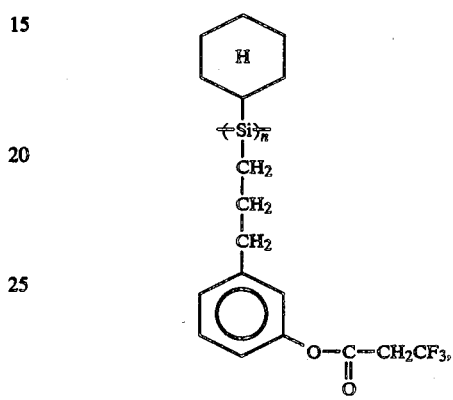

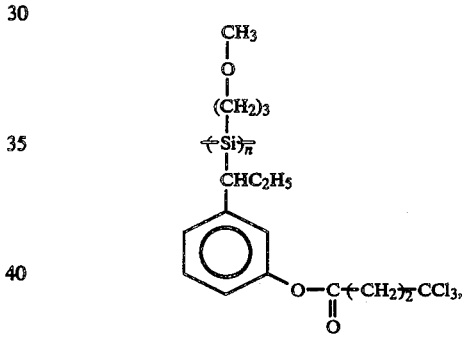

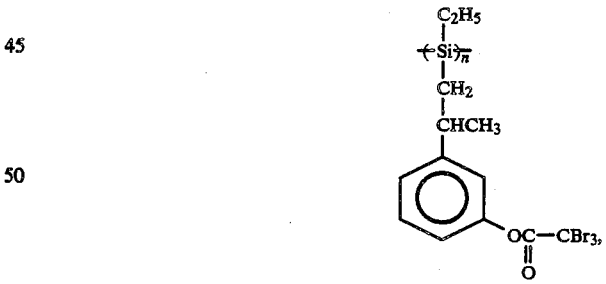

<Polysilane containing unit represented by formula III>

Substituents $R^6$ to $R^{10}$ (a) Alkyl group having 1 to 10 carbon atoms

Examples are a methyl group, an ethyl group, an n-propyl group, an isopropyl, an n-butyl group, an isobutyl group, a t-butyl group, a pentyl group, a hexyl group, a cyclohexyl group, an octyl group, a nonyl group, and a decyl group.

(b) Substituted or nonsubstituted aryl group

Examples are the same as described for $R^1$.

Substituent $R^{11}$

Examples of an alkylene group having 1 to 5 carbon atoms are

—CH₂—, —CH₂—CH₂—,

—CH₂—CH₂—CH₂—, —CH₂—CH₂—CH₂—CH₂—,

—CH₂—CH₂—CH₂—CH₂—CH₂—,

—CH₂—CH—, —CH—CH₂—, and —CH—
        |          |             |
        CH₃    CH₃      CH₂—CH₃

Examples of polysilane containing unit represented by formula III

The polysilane may be either a homopolymer or copolymer as long as it contains a unit of formula III. Examples are listed in Table 4 below.

TABLE 4

TABLE 4-continued

TABLE 4-continued

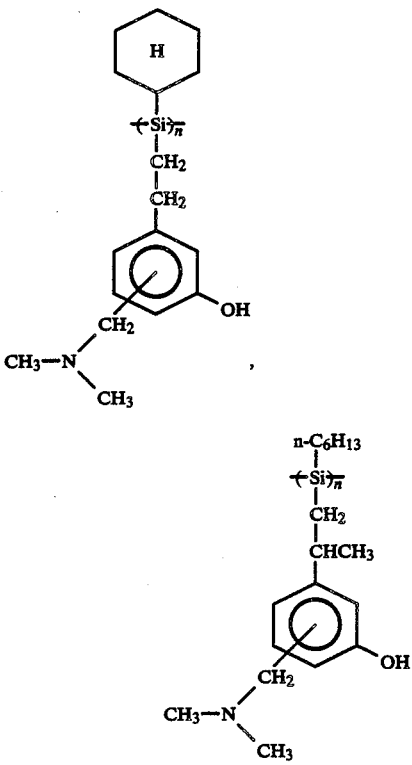

Note that the polysilane according to the present invention may contain two or more units represented by formula I, II, or III.

A method of synthesizing the polysilane according to the present invention will be described below.

<Synthesis of polysilane containing the unit represented by formula I>

Dichlorosilane having an OH-group containing substituent such as hydroxyalkyl group or hydroxyphenyl group was used as a starting material, and the OH-group was protected by a trimethylsilyl group. Then, the resultant material was mixed with a sodium dispersion in toluene or xylene and refluxed at 100° to 120° C. for one to two hours. As a result, the Wurtz analogous reaction occurred to form a backbone chain of an Si-Si bond. Subsequently, a residual insoluble portion such as nonreacted sodium was removed by filtration, and methanol was added at room temperature to perform methanolysis. Therefore, the trimethylsilyl group protecting the OH-group was removed, and a polysilane having the OH-group in a side chain was produced. Subsequently, this product was condensed and then refined by reprecipitation.

Thereafter, the polysilane having the OH-group in the side chain prepared as described above was reacted with a cyclic acid anhydride such as maleic anhydride, thereby preparing an objective polysilane. That is, the above polysilane was dissolved in tetrahydrofuran, and the acid anhydride and amine as a catalyst were added in the resultant solution and reacted at room temperature to 10° C. for about an hour. As a result, the OH-group in the side chain was acylated by the acid anhydride, and at the same time, a ring of the cyclic acid anhydride was opened, thereby generating a carboxyl group. Therefore, when the resultant solution was poured into an aqueous HCl solution, the polysilane having the unit of formula I was precipitated. This polysilane was refined by reprecipitation and then dried.

<Synthesis of polysilane containing unit represented by formula II>

First, dichlorosilane having a hydroxyphenyl group as a substituent was used as a starting material to prepare a polysilane having a hydroxyphenyl group in a side chain, following the same procedures as described above. Then, the above polysilane having a phenolic OH-group was reacted with a halogeno acid halide to prepare an objective polysilane. That is, the above polysilane was dissolved in tetrahydrofuran, and the hologeno acid halide and amine as a catalyst were added in the resultant solution and reacted at room temperature to 10° C. for about an hour. As a result, since the OH-group in the side chain was acylated by the halogeno acid halide, the halogenate alkyl group was bonded to the side chain through ester bonding. Therefore, when the resultant solution was poured into an aqueous HCl solution, the polysilane having the unit of formula II was precipitated. This polysilane was refined by reprecipitation and then dried.

<Synthesis of polysilane containing unit represented by formula III>

First, following the same procedures as described above, a polysilane having a hydroxyphenyl group in a side chain was prepared. Then, this polysilane having a phenolic OH-group was aminoalkylated by Mannich reaction to prepare an objective polysilane. That is, the above polysilane was dissolved in tetrahydrofuran, and an aldehyde and amine were added in the resultant solution and then reacted at 40° to 55° C. for 4 to 5 hours. As a result, an aminoalkyl group was introduced into a phenol ring of the side chain. Thereafter, when the resultant solution was poured into an aqueous solution, the polysilane having the unit of formula III was precipitated. This polysilane was refined by reprecipitation and then dried.

Now a photosensitive composition according to the present invention will be described below.

The photosensitive composition of the present invention utilizes specific photosensitivity of a polysilane containing a unit represented by formula I, II, or III described above. That is, this polysilane causes radical cleavages in response to deep UV light and decomposed into low-molecular fragments, thereby increasing solubility. Therefore, this polysilane can be directly used as a positive type photo resist. On the other hand, this polysilane also responds to electron beam. In this case, generated free radicals cause a crosslinking reaction to decrease solubility. That is, in this case, this polysilane can be directly used as a negative type photo resist. Each of the polysilanes according to the present invention, when used as a photosensitive compound, can be developed by use of an organic solvent.

In addition, a polysilane containing the unit represented by formula I is also soluble in an alkaline aqueous solution, since a carboxyl group is bonded to a side chain of the polysilane. For this reason, this polysilane can be advantageously developed using an alkaline aqueous solution without an organic solvent.

On the other hand, the polysilane containing the unit represented by formula II is easy to cause the radical reaction and has high cleavage rate of Si-Si bonds, because the reactivity of the polysilane is enhanced due to the halogen atom bonded to the side chain. Therefore, such the polysilane has higher sensitivity for a photosensitive composition than the other polysilane without the halogen atom in the side chain. If the nonreacted phenol side chain is remained, the polysilane can also be developed using an alkaline aqueous solution. In the polysilane having a nonreacted phenol side chain, preferable content ratio of the unit represented by formula II is 0.2 to 0.6 in order to obtain good resolution and good sensitivity.

Furthermore, since the photosensitive composition according to the present invention has an excellent oxygen-plasma resistance as a photosensitive composition using a conventional polysilane, it can be suitably used in a double-layer resist system using reactive ion etching by oxygen plasma.

The photosensitive composition of the present invention may be used together with a sensitizer as needed. The sensitizer is needed when the polysilane is exposed with light to which the polysilane is not sensitive. The type of the sensitizer is not limited. That is, either a positive or negative type sensitizer can be used in accordance with whether the polysilane is used as a positive or negative type photo resist. Examples of the sensitizer are as follows.

A first category is an azide compound which is an negative type sensitizer. Examples of the azide compound are 4,4'-diazidochalcone, 2-methoxy-4'-azidechalcone, 1-(p-azidophenyl)-4-(2-furyl)-1,3-butadiene, 2,6-bis(azidobenzal)cyclohexanone, 2,6-bis(4'-azidobenzal)-4-methylenecyclohexanone, 1,3-bis(4'-azidobenzal)-2-propanone, 1,3-bis(4'-azidocinnamylidene)-2-propanone, 4,4'-diazidostilbene, 4,4'-diazidobiphenyl, 4,4'-diazidodiphenylsulfide, 3,3'-diazidodiphenylsulfide, 4,4'-diazidodiphenysulfone, 3,3'-diazidodiphenylsulfone, and 4,4'-diazidostilbene.

A second category is a compound which is a positive type sensitizer containing a naphthoquinonediazide group or benzoquinonediazide group. These compound can be prepared by condensing a naphthoquinonediazide sulfonic acid chloride or a benzoquinonediazide sulfonic acid chloride with a low- or high-molecular compound having a phenolic hydroxy group in the presence of a weak alkali. Examples of the low-molecular compound to be condensed are hydroquinone, resorcin, phloroglucin, 2,4-dihydroquinone-benzophenone, 2,3,4-trihydroxybenzophenone, 2,4,2',4'-tetrahydroxybenzophenone, 3,4,5-trihydroxy-benzoic acid ethyl ester, gallic acid alkyl ester, catechin, quercetine, morin-alizarin, quinalizarin, and purpurin. Examples of the high-molecular compound to be condensed are a phenolformaldehyde novolak resin, a cresol-formaldehyde novolak resin, and polyhydroxystyrene. In the above second category, a naphthoquinonediazide sulfonic acid ester is preferable.

The above sensitizers can be used singly or in a combination of two or more sensitizers. In an exposure apparatus currently widely used, a g-line (wavelength =436 nm) of a mercury emission spectrum is used as a light source. Therefore, a sensitizer having sensitivity with respect to light having a wavelength of 436 nm can be suitably used. Examples of such a sensitizer are bis(1-naphthoquinone-2-diazido-5-sulfonic acid)-2,3,4-trihydroxybenzophenone ester, and tri(1-naphthoquinone-2-diazido-5-sulfonic acid)-2, 3,4,4'-tetrahydroxybenzophenone ester.

A amount of the above sensitizer is preferably 5 to 100 parts by weight with respect to 100 parts by weight of the polysilane. When the amount of the sensitizer is less than 5 parts by weight, a sufficient solubility difference is not produced between exposed and unexposed portions. Therefore, it is difficult to form a good pattern. On the contrary, when the amount exceeds 100 parts by weight, a film formation property of the photosensitive composition is reduced. More preferable amount of the sensitizer is 10 to 50 parts by weight.

An alkali soluble resin may be added to the photosensitive composition of the present invention as an arbitrary component. This alkali soluble resin is added to improve the film formation property of the photosensitive composition and to compensate for solubility in an aqueous alkaline solution as a developer. As the alkali soluble resin, any resin can be used as long as it is dissolved in an alkaline solution. However, a resin having a phenolic hydroxyl group is preferred. An example of the resin having a phenolic hydroxyl group is a novolak resin. The novolak resin can be prepared by condensation polymerization between a phenol compound such as phenol, o-chlorophenol, m-chlorophenol, p-chlorophenol, m-cresol, p-cresol, bisphenol A, or 4-chloro-3-cresol and formaldehyde. Other examples of the resin are poly(p-vinylphenol), poly(p-isopropenylphenol), poly(m-isopropenylphenol), a copolymer of p-hydroxystyrene and methyl methacrylate, a copolymer of p-isopropenylphenol and methyl methacrylate, and a copolymer of p-hydroxystyrene and methacrylic acid.

The above alkali soluble resin can be used singly or in a combination of two or more resins. An addition amount of the resin is preferably 2 to 200 parts by weight with respect to 100 parts by weight of the polymer. If the amount is too large, oxygen-plasma resistance is reduced.

Other arbitrary addition components are, e.g., a thermal-polymerization inhibitor for increasing storage stability, an antireflection agent for preventing reflection from a substrate, an adhesion improving agent for improving adhesion strength between the photosensitive composition and the substrate, and a leveling agent such as a surface active agent for flattening a film surface.

The photosensitive composition of the present invention is dissolved in a suitable solvent and then applied on a predetermined substrate. Any solvent may be used as long as it can dissolve the polysilane as a main component, but a polar organic solvent is preferable. Examples of the polar organic solvent are a solvent of ketone series such as acetone, methyl ethyl ketone, methyl isobutyl ketone, or cyclohexanone; a solvent of cellosolve series such as methyl cellosolve, methyl cellosolve acetate, or ethyl cellosolve acetate; and a solvent of ester series such as ethyl acetate, butyl acetate, or isoamyl acetate.

A method of applying the photosensitive composition of the present invention to the double-layer resist system for forming a pattern will be described below.

First, a planarizing agent is applied and dried on a substrate to form a planarizing layer having a predetermined thickness. Examples of the substrate are a silicon wafer on which an IC is to be formed (this wafer may already have various insulating layers, electrodes, and wirings and hence have a relatively large step) and a blank mask (a quartz plate) for forming an exposure mask. As the planarizing agent, a high-molecular material from which a thin film can be formed and which has purity not adversely affecting the manufacture of a semiconductor device is used. Examples of the high-molecular material are a positive type photo resist consisting of a novolak resin and substituted naphthoquinonediazide, polystyrene, polymethacrylate, polyvinylphenol, a novolak resin, polyester, polyvinylalcohol, polyethylene, polypropylene, polyimide, polybutadiene, polyvinyl acetate, and polyvinyl butyral. These planarizing agents may be used singly or in a combination of two or more agents. In order to absorb light reflected from the substrate surface, a light absorbing agent may be added.

The flattening agent as described above is dissolved in a solvent and then applied on the substrate. Examples of the preferred solvent for forming the solution are toluene, xylene, ethyl cellosolve acetate, and cyclohexanone. The viscosity of the solution is preferably 20 to 100 cps, and more preferably, 60 to 100 cps. A thickness of the planarizing layer is preferably 1 to 2 $\mu$m, and more preferably, 1.5 to 2.0 $\mu$m. When the thickness of the planarizing layer is less than 1 $\mu$m, planarization cannot be achieved. On the contrary, when the thickness exceeds 2 $\mu$m, resolution is reduced.

Note that baking may be performed after the solution of the planarizing agent is applied and dried. Baking temperature is set to be high enough to evaporate the solvent and higher than a glass transition temperature of the flattening agent. Baking is normally performed at 50° to 250° C. for 0.5 to 120 minutes, and preferably, 80° to 220° C. for 5 to 90 minutes.

Then, a solution of the photosensitive composition of the present invention is applied and dried on the planarizing layer formed as described above, thereby forming a photosensitive layer. Examples of the solvent for forming the solution are as described above. For applying the solution of the photosensitive composition, spinning application method using a spinner, dipping method, spraying method, and printing method may be employed. When a spinner is used, the viscosity of the solution is preferably 10 to 100 cps, and more preferably, 10 to 60 cps. If the photosensitive layer is too thin, a sufficient oxygen-RIE resistance cannot be obtained. On the contrary, if the layer is too thick, resolution is reduced. Therefore, the thickness of the photosensitive layer is preferably 0.2 to 1.2 $\mu$m, and more preferably, 0.3 to 0.8 $\mu$m.

Then, light such as visible light, ultraviolet rays, or electron beam is radiated through a mask to selectively expose desired region of the photosensitive layer. As a result, a solubility difference in the developer is produced between exposed and unexposed portions. As an exposure method, either contact exposure or projection exposure may be used. Although an exposure amount depends on the type of a used photosensitive composition, it is normally 1 to 1,000 mJ/cm$^2$.

Subsequently, the exposed photosensitive layer is developed to form a desired upper resist pattern. Examples of the developer are aqueous alkaline solutions such as an aqueous tetramethylammonium hydroxide solution, an aqueous ammonium hydroxide solution, an aqueous sodium hydroxide solution, and an aqueous potassium hydroxide solution. In general, a concentration of the aqueous alkaline solution is 15 wt % or less. As described above, it is a great advantage of the present invention that the aqueous alkaline solutions can be used as the developer. As a developing method, dipping, spraying, or the like may be used. In the developing process, one of the exposed portion (in the case of a positive type) and the unexposed portion (in the case of the negative type) is dissolved, thereby forming a desired pattern. After development, the developing agent is removed by water.

Then, the underlying flattening layer is patterned by oxygen-plasma RIE using the upper resist pattern as a etching mask. In the RIE process, since the upper resist pattern is exposed to oxygen plasma, a thin film having a composition close to $SiO_2$ is formed on its surface. The oxygen-RIE resistance of the upper resist pattern is increased to 10 to 20 times that of the underlying flattening layer due to the $SiO_2$ thin film. Therefore, the upper resist pattern can serve as an effective etching mask. As a result, the planarizing layer is patterned in accordance with the upper resist pattern with high accuracy. For this reason, a resist pattern having a stacking structure consisting of the upper resist layer and the planarizing layer and having a good profile is obtained. Note that the oxygen RIE is normally performed for 1 to 120 minutes under the conditions of $1 \times 10^{-5}$ to $1 \times 10^{-1}$ torr and 50 to 500 W.

The substrate is subjected to a treatment such as selective etching using a resist pattern of the double-layer structure obtained as described above as an etching mask. In the case of etching, either wet etching or dry etching may be performed. However, dry etching is preferable to form a fine pattern of 3 $\mu$m or less. An etchant used in wet etching depends on a substrate material to be etched. For example, an aqueous hydrofluoric acid solution or an aqueous ammonium fluoride solution is used to etch a silicon oxide film; an aqueous phosphoric acid solution, an aqueous acetatic acid solution, or an aqueous nitric acid solution is used to etch aluminum; and an aqueous cerium ammonium solution is used to etch a chromium containing material. Examples of an etching gas used in dry etching are $CF_4$, $C_2F_6$, $CCl_4$, $BCl_3$, $Cl_2$, and HCl. These etching gases may be used in combination as needed. In any of the above etching methods, specific conditions for etching are arbitrarily set in accordance with an object to be etched and the type of a resist pattern used as an etching mask.

After the treatment is finished, the resist pattern remained on the substrate surface is removed by a resist releasing agent or by ashing using oxygen plasma. An example of the resist releasing agent is "J-100" (tradename) available from Nagase Kasei K.K.

Note that in the above double-layer resist system, other steps can be added as needed. Examples are a pretreatment step for improving adhesion strength between the photosensitive and flattening layers or the flattening layer and the substrate, a baking step performed before and after development, and an ultraviolet ray re-radiating step performed before dry etching.

The photosensitive composition of the present invention can be applied not only to the above double-layer resist system but also to lithography using a conventional monolayer resist pattern.

The present invention will be described in detail below by way of its Examples.

EXAMPLE 1 (SYNTHESIS OF POLYSILANE)

30 g of a monomer represented by formula [A] of Table 5 (to be presented later) and 70 g of metallic sodium were reacted and polymerized in 100 g of toluene at 110° C. for 3 hours. Thereafter, an insoluble portion was removed from the resultant solution by filtration. Then, methanol was added at room temperature to perform methanolysis, thereby removing a trimethylsilyl group in formula [A]. Subsequently, the resultant solution was concentrated to perform reprecipitation, thereby preparing 10 g of a polysilane represented by formula [B] of Table 5.

0.1 mol of polysilane [B] were dissolved in tetrahydrofuran. 0.1 mol of succinic anhydride and 0.1 mol of triethylamine were added in the resultant solution and reacted at 50° ~60° C. for 30 minutes. Thereafter, the resultant solution was concentrated and then neutralized. A precipitate produced by this treatment was refined by reprecipitation, thereby preparing 8 g of a polysilane represented by formula [C] of Table 5.

A structure of synthesized polysilane [C] was identified on the basis of a UV spectrum (FIG. 1), an IR spectrum (FIG. 2), and a $H^1$-NMR spectrum (FIG. 3) of the product. Interpretation of the spectrums is as follows.

First, the UV spectrum of FIG. 1 shows maximum absorption (wavelength: 280 to 300 nm) inherent to a backbone chain consisting of an Si-Si bond. As a radiation amount of UV is increased, absorption intensity is reduced. This is because the radical cleavage of Si-Si bond, and this property is inherent to a polymer having an Si-Si bond as a backbone chain. For this reason, it is confirmed that the product is a polysilane.

In the IR spectrum of FIG. 2, a characteristic band of carboxylic acid appears near 1,730 and 3,300 $cm^{-1}$. This means that the product contains a carboxyl group.

In the $H^1$-NMR spectrum of FIG. 3, a chemical shift at each peak indicates the presence of a functional group assigned in FIG. 3. Integrated intensity at each peak indicated by an integration curve represents that 50% of phenolic OH-groups of polysilane [B] were converted into functional groups containing carboxyl groups.

As described above, on the basis of the interpretation of the respective spectrums, it is confirmed that the obtained product is a polysilane represented by formula [C] of Table 5.

Polysilane [C] as the above product was easily dissolved in a polar organic solvent such as methanol, acetone, or tetrahydrofuran, an aqueous solution of organic amine, and an aqueous solution of NaOH.

EXAMPLE 2 (SYNTHESIS OF POLYSILANE)

First, 0.1 mol of polysilane [B] prepared as an intermediate in Example 1 were dissolved in 150 ml of tetrahydrofuran. 0.1 mol of cyclohexane-1,2-dicarboxylic acid anhydride and 0.1 mol of triethylamine were added in the resultant solution and heated and stirred at 50° to 60° C. for 30 minutes. Subsequently, 50 ml of water and then hydrochloric acid were added to precipitate a polymer. This polymer was dissolved in a small amount of methanol, reprecipitated in water, and then dried. As a result, 14 g of a polysilane represented by formula [D] of Table 5 were prepared.

Figure 4:
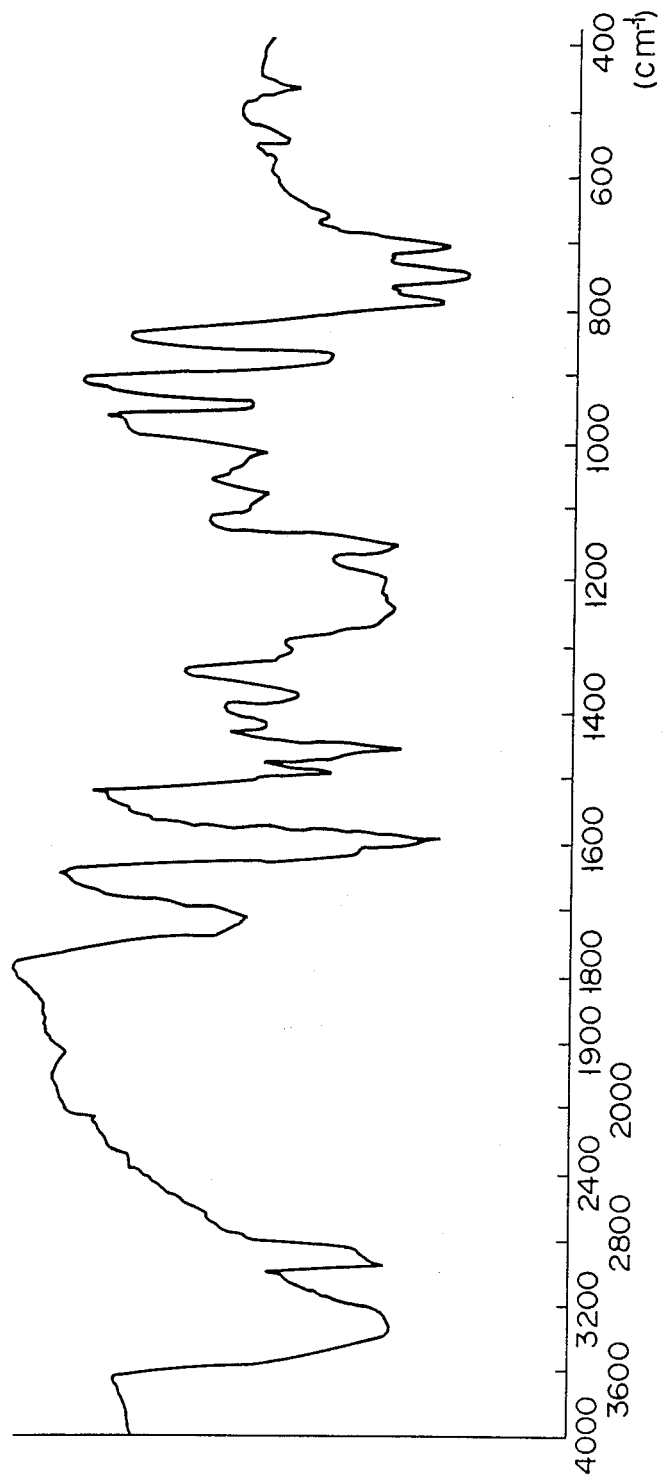
Figure 5:
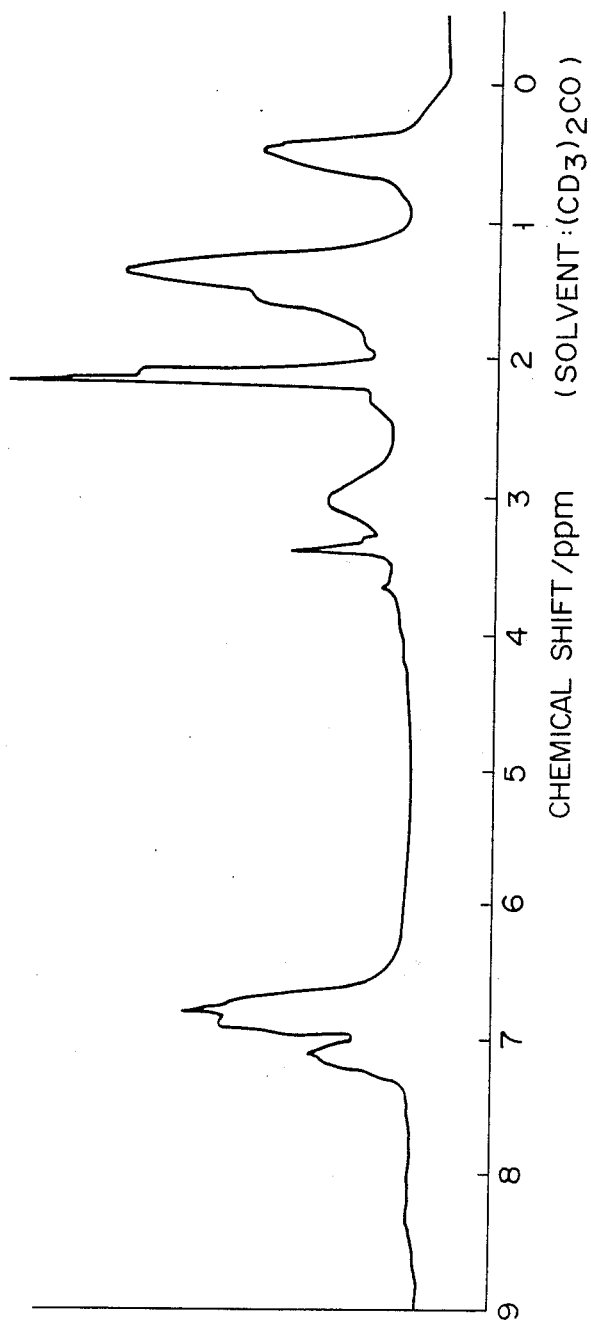

A structure of synthesized polysilane [D] was identified on the basis of an IR spectrum (FIG. 4) and a $H^1$-NMR spectrum (FIG. 5) of the product.

EXAMPLE 3 (SYNTHESIS OF POLYSILANE)

A polysilane represented by formula [E] of Table 5 was prepared following the same procedures as in Example 2 except that polysilane [B] prepared as the intermediate in Example 1 and 4-cyclohexene-1,2-dicarboxylic acid anhydride were used.

Figure 6:
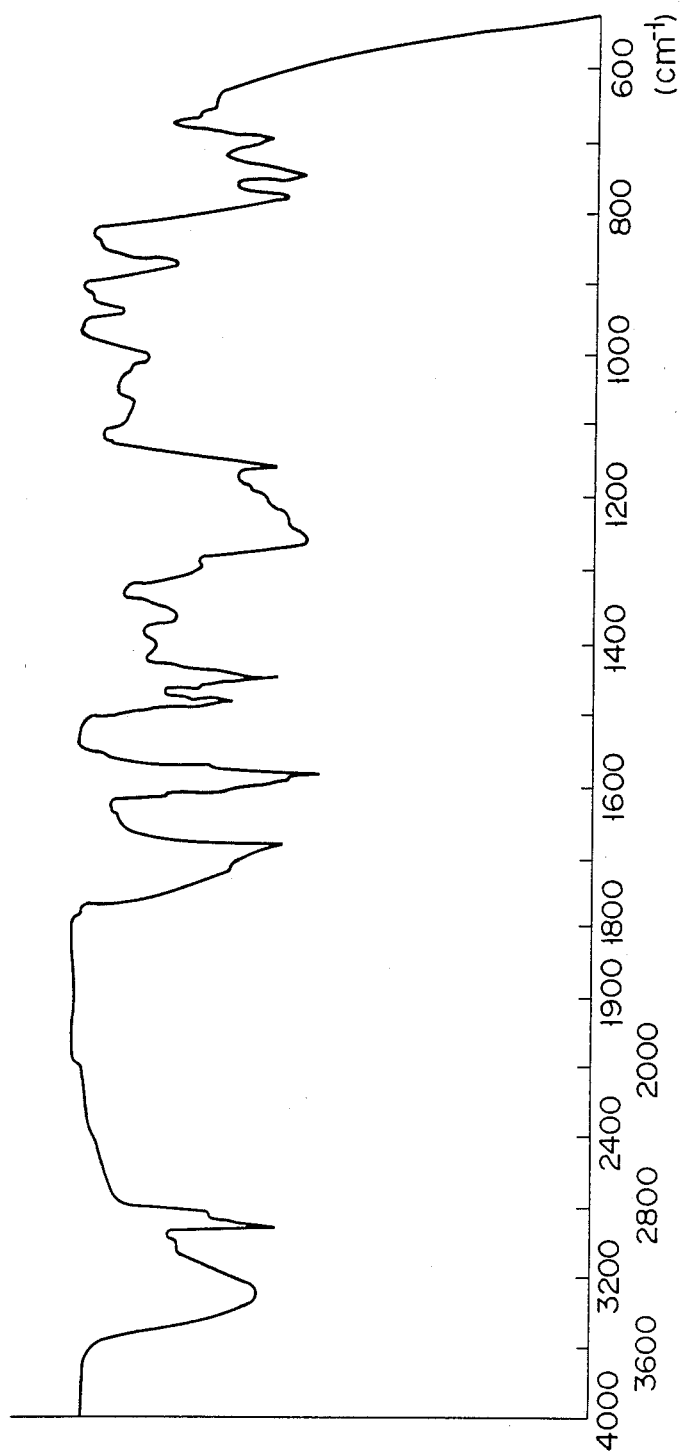

A structure of synthesized polysilane [E] was identified on the basis of an IR spectrum (FIG. 6) and a $H^1$-NMR spectrum (FIG. 7) of the product.

EXAMPLE 4 (SYNTHESIS OF POLYSILANE)

A polysilane represented by formula [F] of Table 5 was prepared following the same procedures as in Example 2 except that polysilane [B] prepared as the intermediate in Example 1 and 5-methyl-4-cyclohexene-1,2-dicarboxylic acid anhydride were used.

Figure 8:
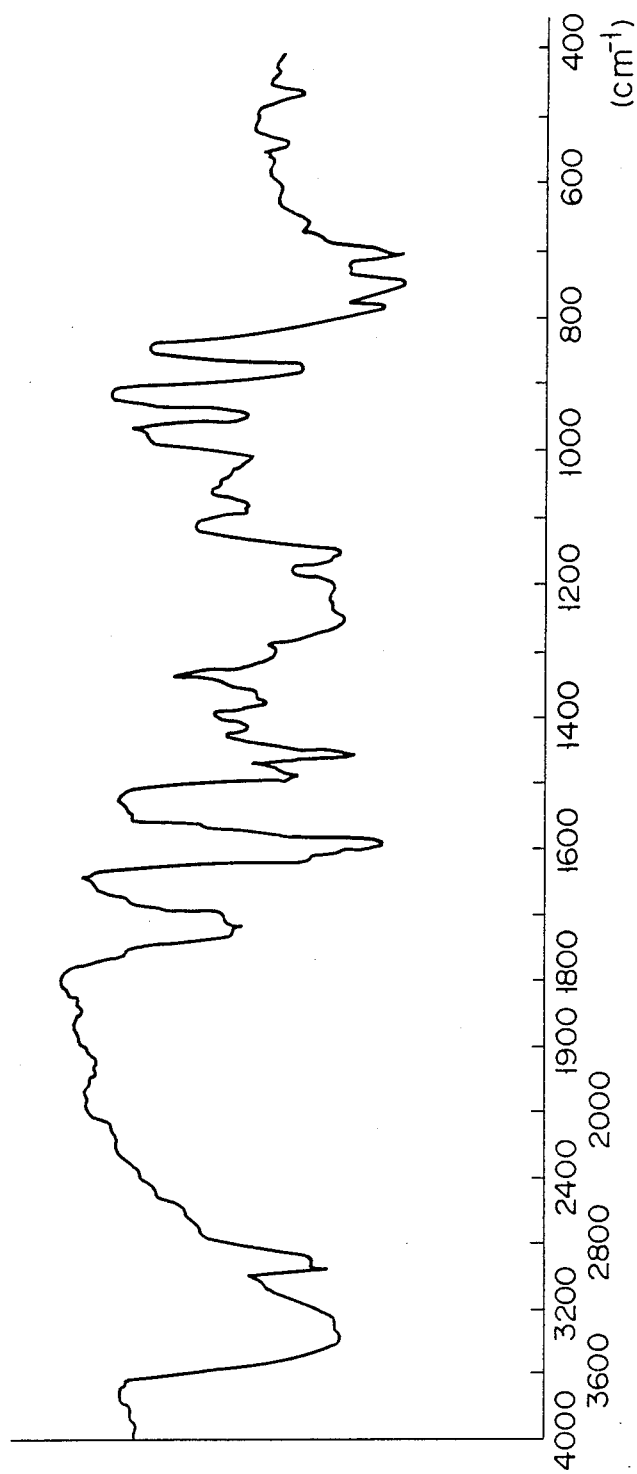
Figure 9:
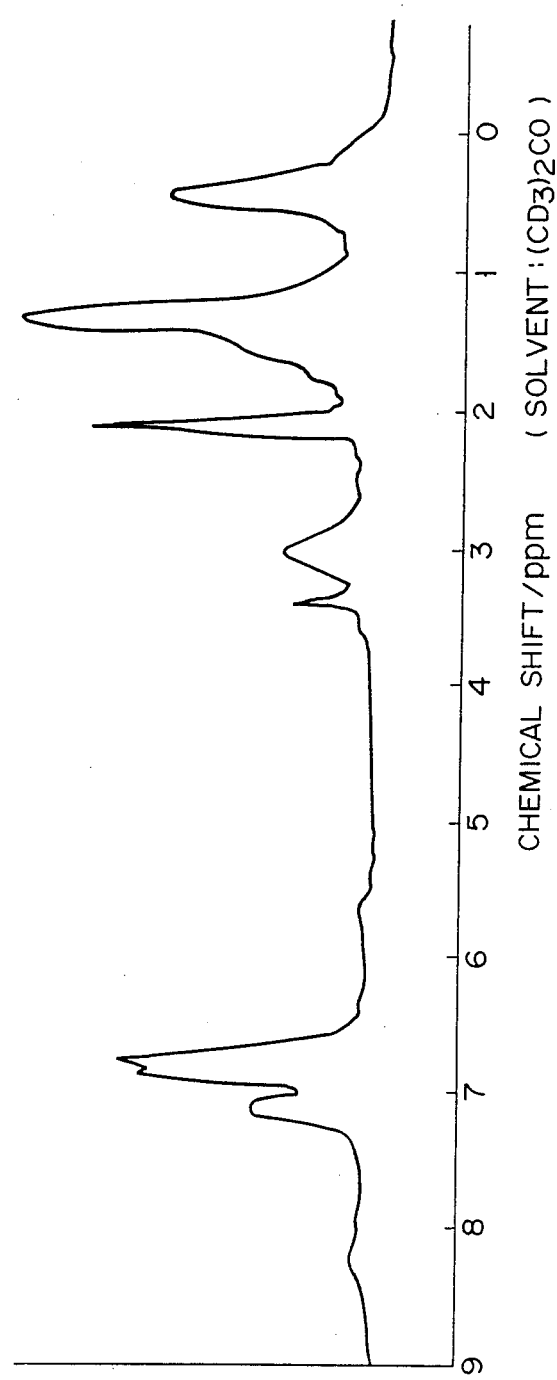

A structure of synthesized polysilane [F] was identified on the basis of an IR spectrum (FIG. 8) and a $H^1$-NMR spectrum (FIG. 9) of the product.

EXAMPLE 5 (SYNTHESIS OF POLYSILANE)

First, following the same procedures as in Example 1, 10 g of a polysilane represented by formula [B] Table 5 were prepared.

Then, 5.0 g of polysilane [B] and 2.2 g of pyridine were dissolved in 50 cc of tetrahydrofuran. 3.2 g of chloroacetyl chloride were added in the resultant solution and then stirred and reacted at room temperature for an hour. Subsequently, tetrahydrofuran and water were added until an insoluble portion was dissolved, and then a diluted hydrochloric acid was dripped to the solution to precipitate a polymer. Thereafter, this polymer was refined by reprecipitation and then dried, thereby preparing a polysilane represented by formula [G] of Table 5.

Figure 10:
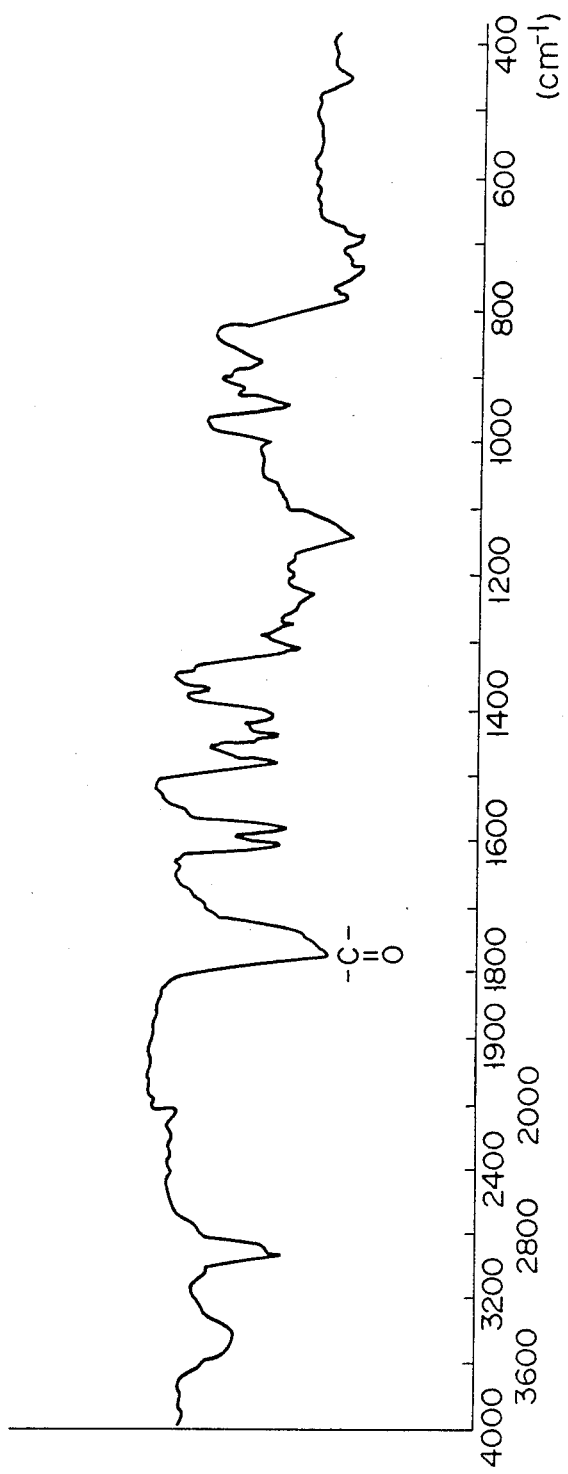
Figure 11:
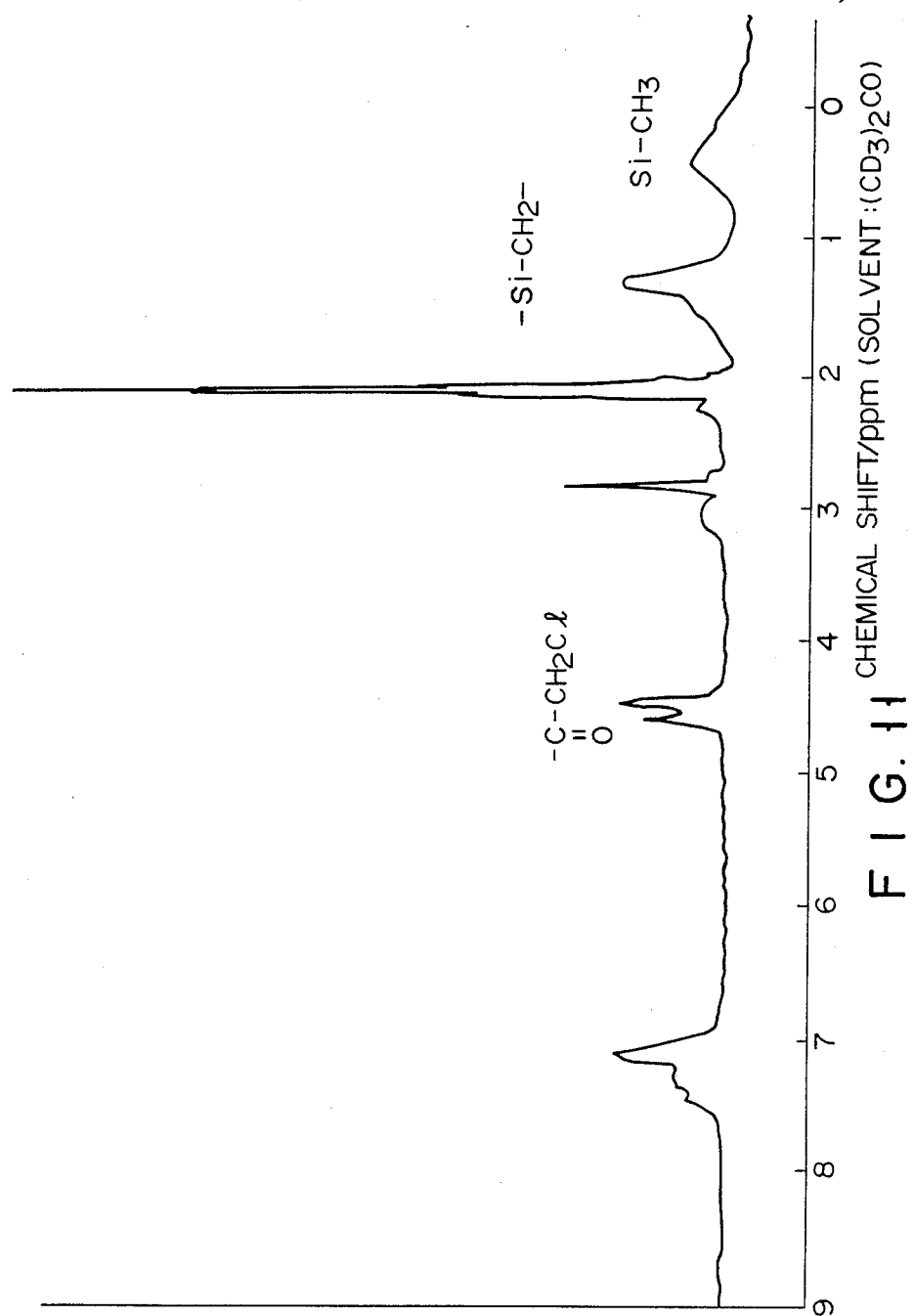

A structure of synthesized polysilane [G] was identified on the basis of an IR spectrum (FIG. 10) and a P-NMR spectrum (FIG. 11) of the product.

It is confirmed that a reduction in a molecular weight caused by UV radiation of polysilane [G] was larger than that of polysilane [B]. The reduction in a molecular weight corresponds to the cleavage of Si-Si bonds. This means that polysilane [G] has high sensitivity.

EXAMPLE 6 (SYNTHESIS OF POLYSILANE)

First, following the same procedures as in Example 1, 10 g of a polysilane represented by formula [B] of Table 5 were prepared.

Then, 5.0 g of polysilane [B] were dissolved in 50 cc of ethanol. 5 g of dimethylamine and 4.3 g of an aqueous formaldehyde solution (37%) were added in the resultant solution and reacted at 50° C. for 5 hours. Subsequently, acetone was added, and the resultant solution was filtered and concentrated. Thereafter, the residue was refined by reprecipitation in water to prepare a polysilane represented by formula [H] of Table 5.

Figure 12:
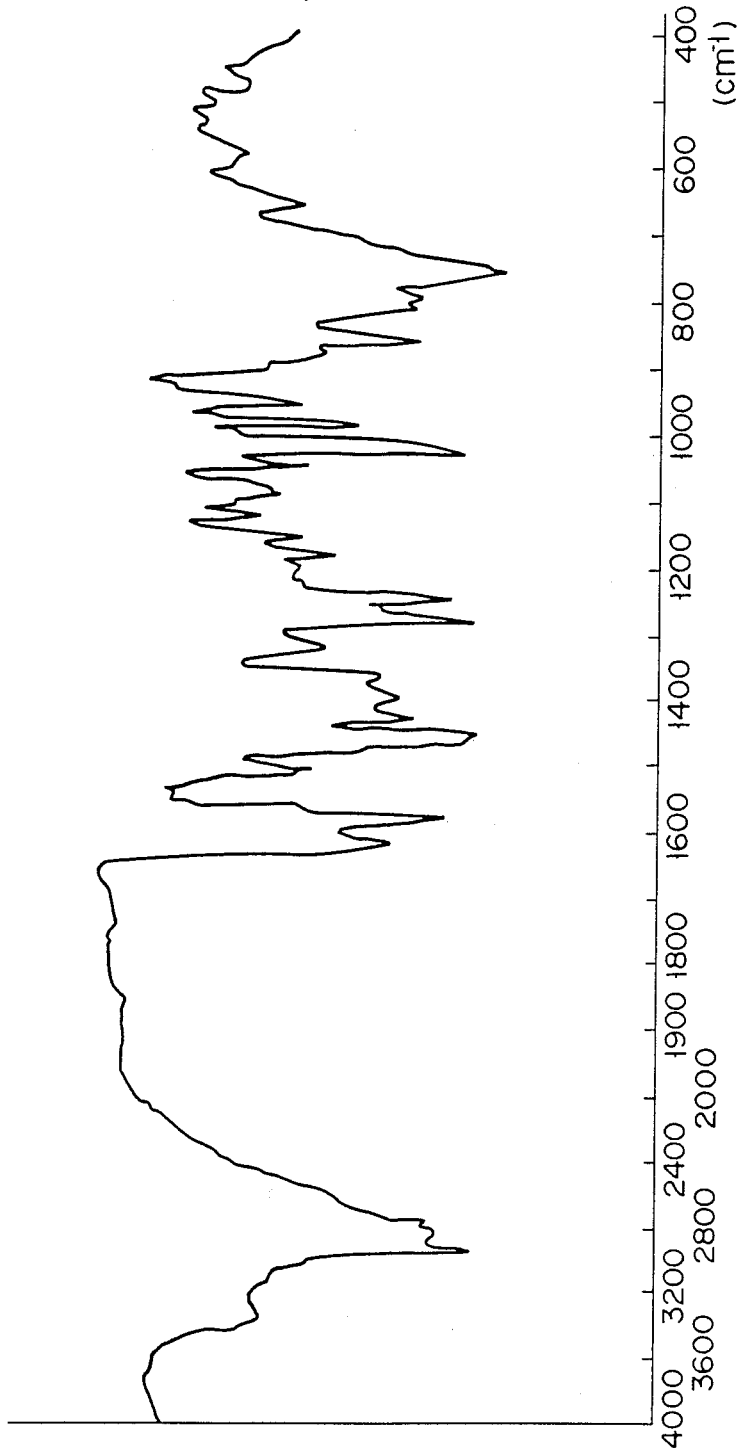

A structure of synthesized polysilane [H] was identified on the basis of an IR spectrum (FIG. 12) and a UV spectrum (FIG. 13) of the product.

EXAMPLE 7 (PHOTOSENSITIVE COMPOSITION)

5 g of polysilane [I] listed in Table 5 were dissolved in 10 g of cyclohexanone to prepare photosensitive composition. Using this photosensitive composition, photolithography was performed by a double-layer resist system as follows.

First, a solution obtained by dissolving a commercially available novolak resin in ethylcellosolve acetate was applied on a silicon wafer by a spinner and heated at 220° C. for an hour, thereby forming a planarizing layer. Subsequently, the photosensitive composition of this example prepared as described above was applied on the wafer by the spinner and dried on a hot plate at 100° C. for 5 minutes, thereby forming a 0.4-μm thick photosensitive layer.

Then, the resultant material was exposed using monochromatic light having a wavelength of 254 nm and dipped in an aqueous tetramethylammonium hydroxide solution (2.38 wt %) for 40 seconds for development, thereby forming an upper resist pattern. Oxygen RIE was performed using this upper resist pattern as an etching mask under the conditions of $2.0 \times 10^{-2}$ torr and 0.6 W/cm$^2$ for only 30 minutes, thereby etching the underlying planarizing layer.

As a result of observing a section of the planarizing layer which has been etched as described above by a scanning electron microscope, it was confirmed that a pattern consisting of lines and spaces each of which was 0.5 μm in width were formed in the planarizing layer, and that each of the lines had steep side faces.

EXAMPLE 8 (PHOTOSENSITIVE COMPOSITION)

5 g of polysilane [I] listed in Table 5 and 2 g of bis(1-naphthoquinone-2-diazido-5-sulfonic acid)-2,3,4-trihydroxybenzophenone ester as a sensitizer were dissolved in 20 of ethylcellosolve acetate to prepare a photosensitive composition. Using this photosensitive composition, photolithography was performed by a double-layer resist system as follows.

First, a flattening layer was formed following the same procedures as in Example 7, and then a photosensitive layer consisting of the photosensitive composition prepared as described above was formed following the same procedures as in Example 7.

Subsequently, the photosensitive layer was exposed with light having a wavelength of 436 nm and then developed following the same procedures as in Example 7, thereby forming an upper resist pattern. Thereafter, oxygen RIE was performed following the same procedures as in Example 7 for etching the planarizing layer. As a result, a planarizing layer pattern consisting of liens and spaces each of which was 0.5 μm in width was formed.

EXAMPLE 9 (PHOTOSENSITIVE COMPOSITION)

5 g of polysilane [I] listed in Table 5 and 2 g of a commercially available cresol novolak resin were dissolved in 15 g of cyclohexane to prepare a photosensitive composition.

Using this photosensitive composition, photolithography was performed by a double-layer resist system following the same procedures as in Example 7. As a result, a planarizing layer pattern consisting of lines and spaces each of which was 0.6 μm in width was obtained.

EXAMPLE 10 (PHOTOSENSITIVE COMPOSITION)

5 g of polysilane [I] listed in Table 5, 3 g of a commercially available cresol novolak resin, and 3 g of bis(1-naphthoquinone-2-diazido-5-sulfonic acid)-2,3,4-trihydroxybenzophenone ester as a sensitizer were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern consisting of liens and spaces each of which was 0.5 μm in width was obtained.

EXAMPLE 11 (PHOTOSENSITIVE COMPOSITION)

5 g of polysilane [J] listed in Table 5 were dissolved in 15 g of ethylcellosolve acetate to prepare photosensitive composition.

Using this photosensitive composition, photolithography was performed by a double-layer resist system following the same procedures as in Example 7. As a result, a planarizing layer pattern consisting of liens and spaces each of which had a width of 0.5 μm was obtained.

EXAMPLE 12 (PHOTOSENSITIVE COMPOSITION)

5 g of polysilane [J] listed in Table 5 and 1 g of bis(1-naphthoquinone-2-diazido-5-sulfonic acid)-2, 3,4-trihydroxybenzophenone ester as a sensitizer were dissolved in 15 g of cellosolve acetate to prepare a photosensitive composition.

Using this photosensitive composition, photolithography was performed by a double-layer resist system following the same procedures as in Example 7. As a result, a planarizing layer pattern consisting of liens and spaces each of which had a width of 0.5 μm was obtained.

EXAMPLE 13 (PHOTOSENSITIVE COMPOSITION)

5 g of polysilane [J] listed in Table 5, 3 g of a commercially available cresol novolak resin, and 2 g of tri(1-naphthoquinone-2-diazido-5-sulfonic acid)-2, 3,4,4'-tetrahydroxybenzophenone ester as a sensitizer were dissolved in 25 g of ethylcellosolve acetate to prepare a photosensitive composition.

Using this photosensitive composition, photolithography was performed by a double-layer resist system following the same procedures as in Example 7. As a result, a planarizing layer pattern consisting of lines and spaces each of which had a width of 0.5 μm was obtained.

EXAMPLE 14 (PHOTOSENSITIVE COMPOSITION)

5 g of polysilane [K] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern consisting of liens and spaces each of which had a width of 0.5 μm was obtained.

EXAMPLE 15 (PHOTOSENSITIVE COMPOSITION)

5 g of polysilane [K] listed in Table 5 and 1 g of bis(1-naphthoquinone-2-diazido-5-sulfonic acid)-2, 3,4-trihydroxybenzophenone ester as a sensitizer were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern consisting of liens and spaces each of which had a width of 0.5 μm was obtained.

EXAMPLE 16 (PHOTOSENSITIVE COMPOSITION)

5 g of polysilane [L] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern consisting of lines and spaces each of which had a width of 0.5 μm was obtained.

EXAMPLE 17 (PHOTOSENSITIVE COMPOSITION)

5 g of polysilane [M] listed in Table 5, 3 g of a commercially available cresol novolak resin, and 2 g of bis(1-naphthoquinone-2-diazido-5-sulfonic acid)-2,3,4-trihydroxybenzophenone ester as a sensitizer were dissolved in 25 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

EXAMPLE 18 (PHOTOSENSITIVE COMPOSITION)

5 g of polysilane [N] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

EXAMPLE 19 (PHOTOSENSITIVE COMPOSITION)

5 g of polysilane [O] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

EXAMPLE 20 (PHOTOSENSITIVE COMPOSITION)

5 g of polysilane [P] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

EXAMPLE 21 (PHOTOSENSITIVE COMPOSITION)

5 g of polysilane [Q] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

EXAMPLE 22 (PHOTOSENSITIVE COMPOSITION)

5 g of polysilane [R] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

EXAMPLE 23 (PHOTOSENSITIVE COMPOSITION)

5 g of polysilane [S] listed in Table 5 were dissolved in 15 g of ethylcellosolve acetate to prepare a photosensitive composition.

Using this photosensitive composition, photolithography was performed by a double-layer resist system following the same procedures as in Example 7. As a result, a planarizing layer pattern having lines and spaces each of which was 0.5 μm in width was obtained.

Note that in each of Examples 7 to 23, a double-layer resist system was used in photolithography. However, the photosensitive composition of the present invention can be used in a single-layer resist system not using a planarizing layer.

As has been described above in detail, according to the present invention, there are provided a new polysilane soluble in polar solvents and a photosensitive composition utilizing photosensitivity inherent to this new polysilane. In addition, according to the present invention, there can be provided a photosensitive composition which can be developed using an aqueous alkaline solution.

TABLE 5

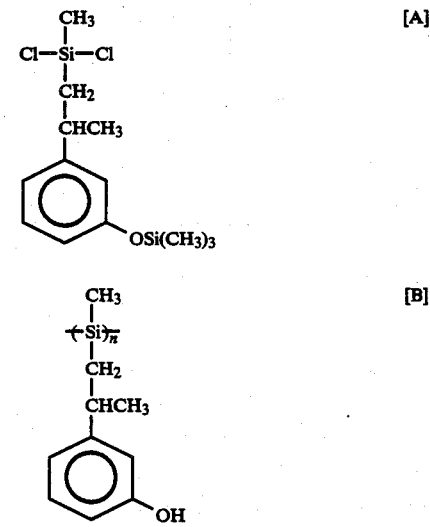

TABLE 5-continued
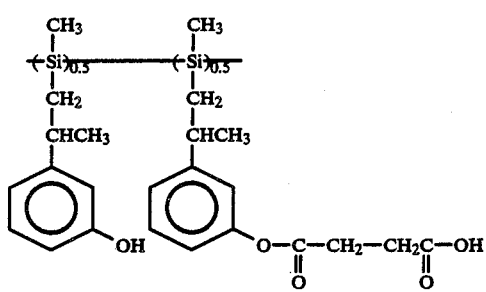 [C]
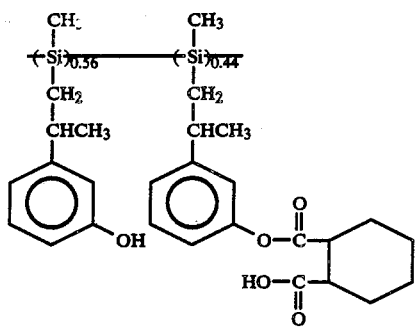 [D]
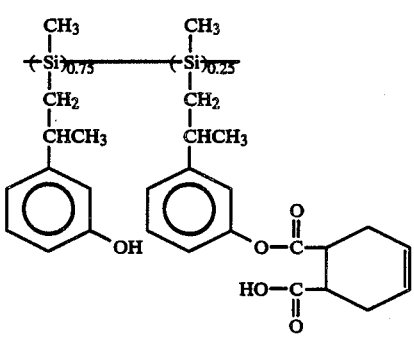 [E]
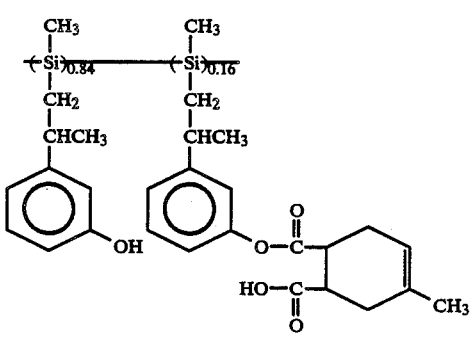 [F]
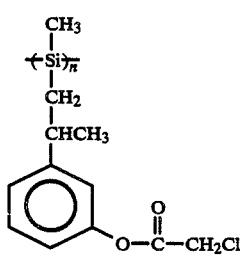 [G]
TABLE 5-continued
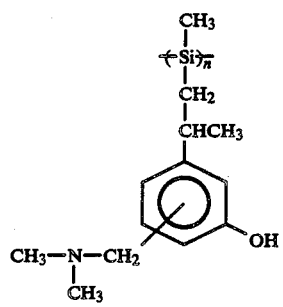 [H]
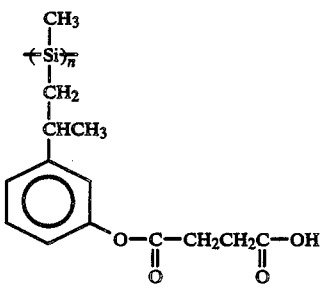 [I]
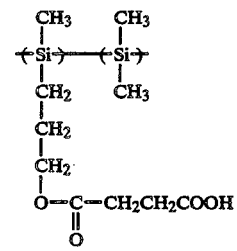 [J]
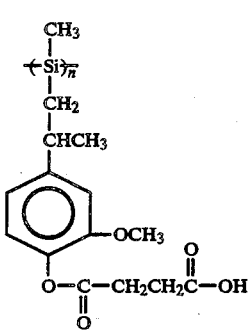 [K]
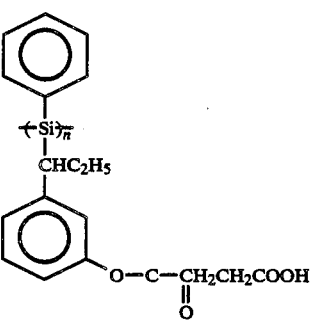 [L]

TABLE 5-continued

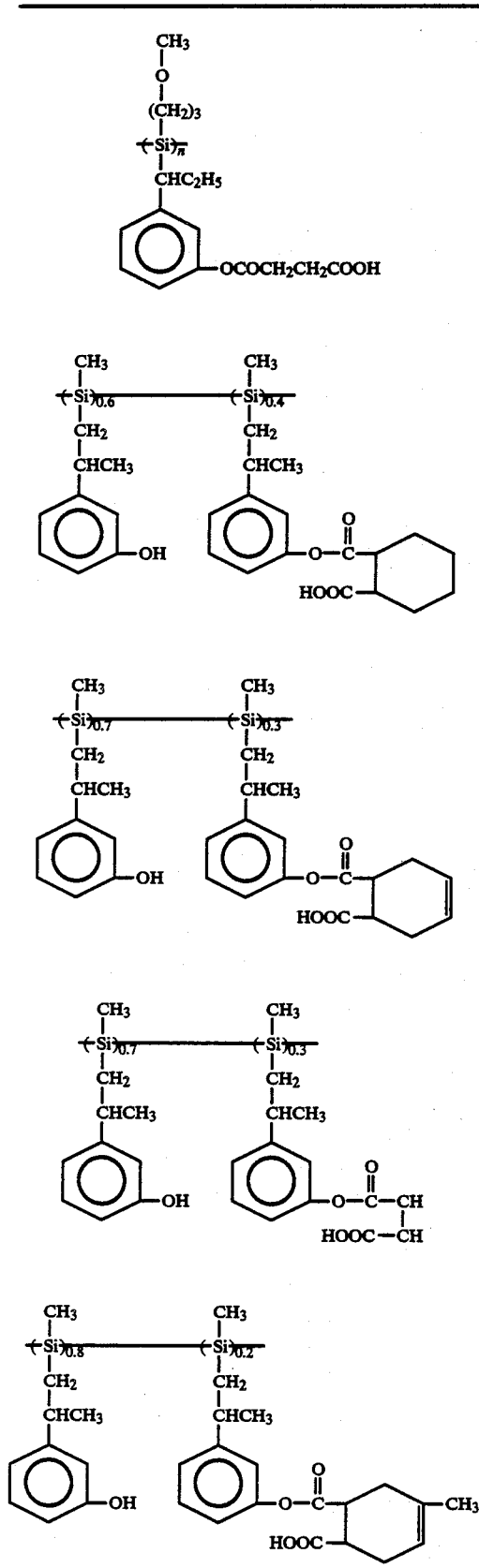

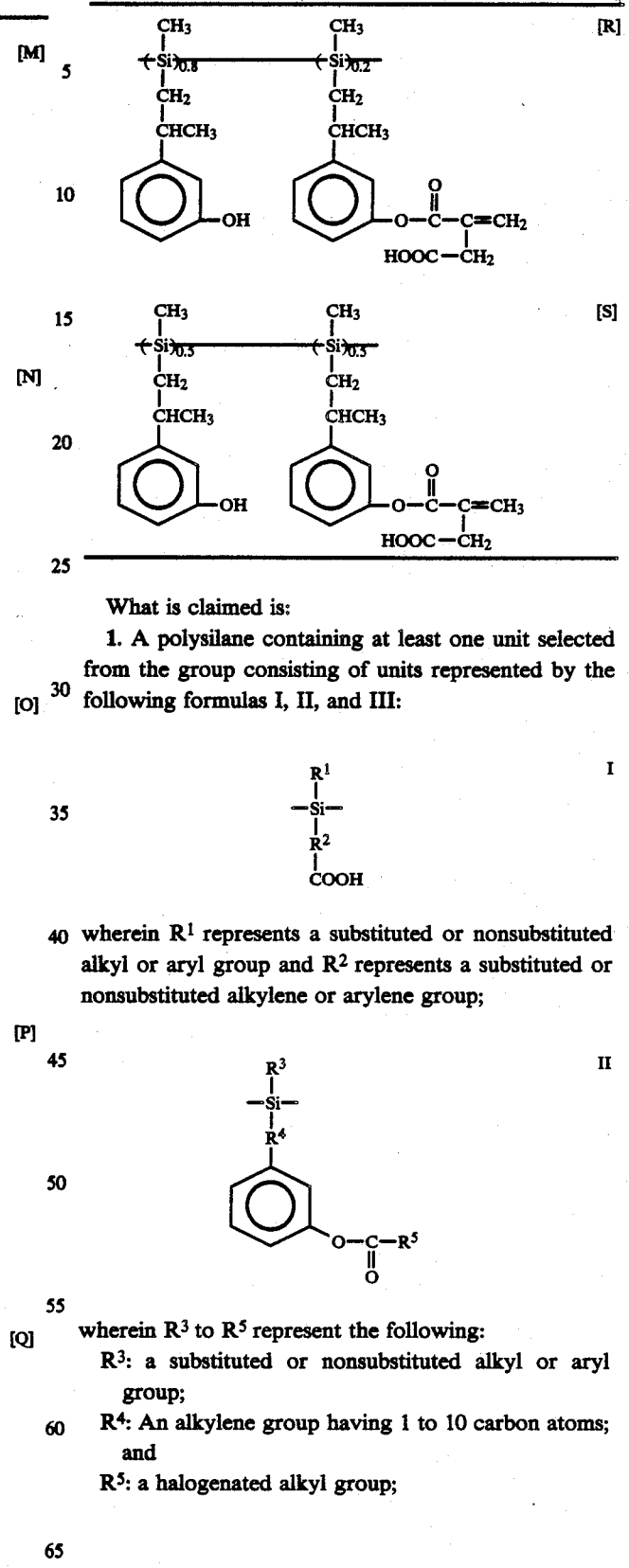

What is claimed is:

1. A polysilane containing at least one unit selected from the group consisting of units represented by the following formulas I, II, and III:

$$-\underset{\underset{COOH}{\overset{R^1}{|}}}{\overset{R^1}{\underset{|}{Si}}}- \qquad \text{I}$$

wherein $R^1$ represents a substituted or nonsubstituted alkyl or aryl group and $R^2$ represents a substituted or nonsubstituted alkylene or arylene group;

$$-\underset{\underset{\underset{\underset{O}{\overset{\|}{C}}-R^5}{|}}{\overset{R^3}{\underset{|}{Si}}}}- \qquad \text{II}$$

wherein $R^3$ to $R^5$ represent the following:
$R^3$: a substituted or nonsubstituted alkyl or aryl group;
$R^4$: An alkylene group having 1 to 10 carbon atoms; and
$R^5$: a halogenated alkyl group;

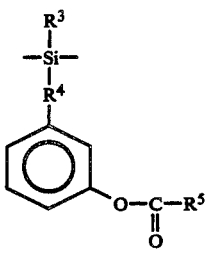

wherein $R^6$ to $R^{11}$ represent the following:

$R^6$, $R^9$ and $R^{10}$: an alkyl group having 1 to 10 carbon atoms or a substituted or nonsubstituted aryl group;

$R^7$ and $R^8$: hydrogen and an alkyl group having 1 to 10 carbon atoms or a substituted or nonsubstituted aryl group; and $R^{11}$: an alkylene group having 1 to 5 carbon atoms.

2. A photosensitive composition comprising a polysilane of claim 1.

3. A photosensitive composition comprising a polysilane containing at least one unit selected from the group of units represented by the following formulas I and II:

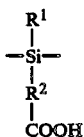

wherein $R^1$ represents a substituted or nonsubstituted alkyl or aryl group and $R^2$ represents a substituted or nonsubstituted alkylene or arylene group;

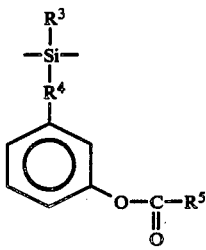

wherein $R^3$ to $R^5$ represent the following:

$R^3$: a substituted or nonsubstituted alkyl or aryl group;

$R^4$: An alkylene group having 1 to 10 carbon atoms; and $R^5$: a halogenated alkyl group.

4. A composition according to claim 3, further comprising a negative or positive type sensitizer.

5. A composition according to claim 4, wherein said sensitizer has sensitivity with respect to a g-line (wavelength): 436 nm) of a mercury emission spectrum.

6. A composition according to claim 5, wherein said sensitizer is bis (1-naphthoquinone-2-diazido-5-sulfonic acid)-2,3,4-trihydroxybenzophenone ester or tri(1-naphtoquinone-2-diazido-5-sulfonic acid)-2,3,4,4'-tetrahydroxybenzophenone ester.

7. A composition according to claim 4, wherein the content of said sensitizer is 5 to 100 parts by weight with respect to 100 parts by weight of polysilane.

8. A composition according to claim 3, further comprising an alkali soluble resin.

9. A composition according to claim 8, wherein said alkali soluble resin contains a phenolic hydroxyl group.

10. A composition according to claim 8, wherein the content of said alkali soluble resin is 5 to 100 parts by weight with respect to 100 parts by weight of the polysilane as a main component.

11. A polysilane according to claim 1, containing at least one unit of formula I.

12. A polysilane according to claim 1, containing at least one unit formula II.

13. A polysilane according to claim 1, containing at least one unit of formula III.

14. A photosensitive composition comprising the polysilane of claim 11.

15. A photosensitive composition comprising the polysilane of claim 12.

16. A photosensitive composition comprising the polysilane of claim 13.

* * * * *

UNITED STATES PATENT AND TRADEMARK OFFICE
CERTIFICATE OF CORRECTION

PATENT NO. : 4,871,646
DATED : Oct. 3, 1989
INVENTOR(S) : Shuzi Hayase, et al

It is certified that error appears in the above-identified patent and that said Letters Patent is hereby corrected as shown below:

On the title page:

The first inventor's name is incorrectly recorded, "Shizu Hayase", should be:

--Shuzi Hayase--

Signed and Sealed this

Twenty-sixth Day of February, 1991

Attest:

HARRY F. MANBECK, JR.

*Attesting Officer*     *Commissioner of Patents and Trademarks*